United States Patent [19]

Riggle et al.

[11] Patent Number: 5,107,503

[45] Date of Patent: Apr. 21, 1992

[54] HIGH BANDWIDTH REED-SOLOMON ENCODING, DECODING AND ERROR CORRECTING CIRCUIT

[75] Inventors: C. Michael Riggle, Colorado Springs, Colo.; Lih-Jyh Weng, Lexington; Pak N. Hui, Worchester, both of Mass.

[73] Assignee: Digital Equipment Corporation, Maynard, Mass.

[21] Appl. No.: 470,423

[22] Filed: Jan. 25, 1990

Related U.S. Application Data

[63] Continuation of Ser. No. 136,206, Dec. 21, 1987, abandoned, which is a continuation of Ser. No. 88,378, Aug. 24, 1987, abandoned.

[51] Int. Cl.$^5$ ........................................... H03M 13/00
[52] U.S. Cl. ................................................. 371/37.1
[58] Field of Search ......................................... 371/37.1

[56] References Cited

U.S. PATENT DOCUMENTS

| 3,668,631 | 6/1972 | Griffith et al. | 371/37 |
| 4,099,160 | 7/1978 | Flagg | 371/37 |
| 4,410,989 | 10/1983 | Berlekamp | 371/40 |
| 4,649,541 | 3/1987 | Lahmeyer | 371/37.1 |

OTHER PUBLICATIONS

K. Y. Liu, "Architecture for VLSI Design of Reed-Solomon Decoders," *IEEE Transactions on Computers*, vol. C-33, No. 2, Feb. 1984, pp. 178-189.
R. E. Blahut, *Theory and Practice of Error Control Codes*, published by Addison-Wesley Publishing Co., Inc., May 1984, pp. 51-53, 79, 174, and 220-224.
Clark, Jr. et al., *Error-Correction Coding for Digital Communications*, Plenum Press, 1981, pp. 188-208.
H. M. Shao et al., "A VLSI Design of a Pipeline Reed-Salomon Decoder", *IEEE Trans. on Computers*, vol. C-34, No. 5, May 1985, pp. 393-403.

*Primary Examiner*—Stephen M. Baker
*Attorney, Agent, or Firm*—Cesari & McKenna

[57] ABSTRACT

A pipelined error correction circuit iteratively determines syndromes, error locator and evaluator equations, and error locations and associated error values for received Reed-Solomon code words. The circuit includes a plurality of Galois Field multiplying circuits which use a minimum number of circiut elements to generate first and second products. Each Galois Field multiplying circuit includes a first GF multiplier which multiplies one of two input signals in each of two time intervals by a first value to produce a first product. The circuit includes a second GF multiplier which further multiplies one of the first products by a second value to generate a second product. The first and second products are then applied to the first GF multiplier as next input signals. The multiplying circuit minimizes the elements required to generate two products by using a first, relatively complex multiplier for both the first and second products and then a second relatively simple multiplier to generate the second product. This simplifies the multiplying circuit which would otherwise require two relatively complex multipliers. The error correction circuit determines, for each received code word, an error locator equation by iteratively updating a preliminary error locator equation. The circuit determines for a given iteration whether or not to update the preliminary error locator equation by comparing a particular variable with zero.

27 Claims, 19 Drawing Sheets

HIGH BANDWIDTH REED-SOLOMON ENCODING, DECODING AND ERROR CORRECTING CIRCUIT

This application is a continuation of Ser. No. 136,206, filed on Dec. 21, 1987, now abandoned, which is a continuation in part of U.S. Patent Application of C. M. Riggle and L. J. Weng for "High Bandwidth Reed-Solomon Encoding, Decoding and Error Correcting Circuit" Ser. No. 088,378 filed on Aug. 24, 1987, now abandoned.

BACKGROUND OF THE INVENTION

I. Field of the Invention

This invention relates to using VLSI architecture for high bandwidth, low latency execution of the Reed-Solomon encode, decode, and error correction functions, capable of correcting a large number of symbol errors in binary digital data.

II. Description of the Related Art

Electronic communications and data processing systems transmit, receive and store electromagnetic signals representative of binary "zeros" and "ones." During data transfer along data channels, or during the process of storing data on and retrieving data from various magnetic, optical or other storage media, erroneous data values may occur. These errors may be the result of electromagnetic noise on the data channel or defects in the storage media. Isolated single bit random errors and contiguous multibit "bursts" of errors must be recognized and corrected using a system that is highly reliable, that is, one that does not produce many errors in the corrected data. At a minimum, the erroneous data must be recognized and flagged as erroneous rather than being acted upon.

Unlike data communications systems that have the luxury of retransmitting data until an error free transmission occurs, erroneous data stored on magnetic, optical or other storage media are permanently lost unless they can be corrected. By encoding data prior to storage or transmission, and decoding following reception or retrieval, errors may be detected and corrected prior to the data being released for subsequent use. Reed-Solomon codes are effective for the types of independent and bursty errors experienced on magnetic storage media. Information on encoding, decoding, and Reed-Solomon codes in particular may be found in "Error Correcting Codes" by Peterson and Weldon, The MIT Press, second edition (1972) and several other texts.

For binary data storage and retrieval systems, error correction begins prior to storing data on the applicable medium, here considered to be a magnetic disk. First the data are encoded using an (N,K) Reed-Solomon code word of N m-bit symbols, consisting of K data symbols and N−K Error Correction Code (ECC) symbols. The ECC symbols are redundant and provide the information necessary to recognize erroneous data symbols and to reconstruct a maximum of $T=(N-K)/2$ data symbols.

A symbol is a series of m bits, for example, 6 or 10. The data stream of binary digits destined for storage on a disk sector usually consists of a series of 8, 16 or 32 bit words and must be converted to a series of data symbols. The N symbols of the code word are representative of the coefficients of a polynomial in x of degree $N-1$ represented by a(x) where $\deg(a)=N-1$. ECC symbols are generated such that each code word is evenly divisible by a generator polynomial, g(x), having $N-K$ consecutive roots in the Galois Field, GF $(2^m)$, and where each ECC symbol is an element $a^i$ of $GF(2^m)$. The generator polynomial, g(x) is chosen based on the extent and complexity of the error correction scheme, that is, how many symbols of detection and correction are desired. In an (N,K) code, $\deg(g)=N-K$. If d(x) is a polynomial in x of degree $K-1$ with K data symbols $d_i$ as coefficients, then the code word a(x) is:

$$a(x)=d(x)*x^{(N-K)}+e(x)$$

where $$e(x)=\text{Remainder of } [d(x)*x^{(N-K)}/g(x)]$$

The coefficients of e(x) are the ECC symbols $e_i$. This process of dividing the data symbol polynomial d(x) by the generator polynomial g(x) ensures that each stored code word a(x) is evenly divisible by g(x). If a retrieved code word y(x) is error free, y(x) is equal to a(x) and is evenly divisible by g(x). If y(x) is not evenly divisible by g(x) then that code word is assumed to contain an error vector p(x) that must be located and corrected, where $y(x)=a(x)+p(x)$.

The factors of an error locator polynomial, NU(x), and an error evaluator polynomial, W(x), locate the erroneous data symbols within the code word and indicate the values which, when added modulo 2 to the received symbols, provide the correct symbols. The terms of NU(x) are calculated using the Berlekamp-Massey algorithm from the error syndromes, Si, which are obtained by dividing y(x) by the factors of g(x). If a syndrome is non-zero, then part of the code word is in error. The error location is found by computing the roots of the error locator polynomial, NU(x) and then the correct data symbol may be determined by finding the value of W(x) using the syndromes and NU(x). Root finding in a digital environment typically uses Chien's search algorithm. A Reed-Solomon encoding-decoding system that uses the technique of a generator polynomial, syndrome computation, and evaluation of error locator and error evaluator polynomials is described in U.S. Pat. No. 4,413,339 to Riggle et al.

Because of the many computations being performed in software or iteratively in hardware, and the need to calculate the NU(x) and W(x) polynomials and all the roots of NU(x), and to evaluate W(x) prior to correcting erroneous data symbols, prior art decoders suffer from one or more of the drawbacks of high latency, low bandwidth and high cost, especially when many data errors are encountered. Soft error rates for disks are therefore limited to about $1 \times 10^{-6}$ because of the low processing speed or cost of the decoders. Faster Reed-Solomon systems which are also inexpensive have the drawback of being limited to correcting a maximum of only about 4 symbols per sector, which limits the tolerable soft error rates for data storage devices. Cross-interleaved Reed-Solomon decoders have a moderate bandwidth and can correct large numbers of symbol errors, but they introduce excessive storage overhead for disk systems with short disk blocks, thereby reducing the net data density permitted on the disk drive. This defeats one of the primary purposes for implementing the ECC system, which is to allow high density data storage on disk drives along with the inherently high data error rates resulting from increased density data storage.

An object of this invention is to correct higher soft bit error rates on sectorized data storage devices while providing acceptably low hard bit error rates.

Another object of this invention is to provide a high bandwidth, low latency implementation of the Reed-Solomon error correction function where a large number of symbol errors are corrected with a minimum of data storage overhead within a standard disk block.

A further object of this invention is to implement pipelining and flow control processes for executing the Berlekamp-Massey, Weng and modified Chien algorithms, and to provide novel algorithms for computing the degree of the error location polynomial and its control over the Berlekamp-Massey algorithm, so that the Reed-Solomon error correction function can be implemented in hardware in real time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

RELATED APPLICATIONS

U.S. patent application Ser. No. 050,725 titled "Real-Time BCH Error Correction Code Decoding Mechanism" by Lih-Jyh Weng filed on May 15, 1987, abandoned and assigned to the same assignee as the present invention, is hereby expressly incorporated by reference as though set out in full herein.

U.S. patent application Ser. No. 067,712 titled "Apparatus for Computing Multiplicative Inverses in Data Encoding and Decoding Devices" by Lih-Jyh Weng filed on Jun. 26, 1987, now U.S. Pat. No. 4,975,867, and assigned to the same assignee as the present invention, is hereby expressly incorporated by reference as though set out in full herein.

SUMMARY OF THE INVENTION

To achieve the foregoing objects, and in accordance with the purposes of the invention as embodied and broadly described herein, a circuit is provided for detecting and correcting errors in binary data symbols $d_i$ that have passed through an error inducing medium, comprising encoder means for encoding the data symbols into a plurality of Reed-Solomon first code words $a(x)$ and sending the first code words to the error inducing medium; buffer means for receiving from the error inducing medium a plurality of retrieved code words $y(x)$ equal to the first code words in which errors have been induced and for holding each of the retrieved code words for no longer than the time needed to compute error locations and values; decoder means for computing from the retrieved code words a plurality of error locations and correction vectors in real time as each symbol of the retrieved code word exits from the buffer means; and correcting means responsive to the error locations and correction vectors for correcting erroneous data symbols as they exit the buffer means.

The accompanying drawings, which are incorporated in and constitute a part of the specification, illustrate a preferred embodiment of the invention and, together with the general description given above and the detailed description of the preferred embodiment given below, serve to explain the principles of the invention.

DESCRIPTION OF THE PREFERRED EMBODIMENT

Reference will now be made in detail to the present preferred embodiment of the invention as illustrated in the accompanying drawings.

Figure 1:
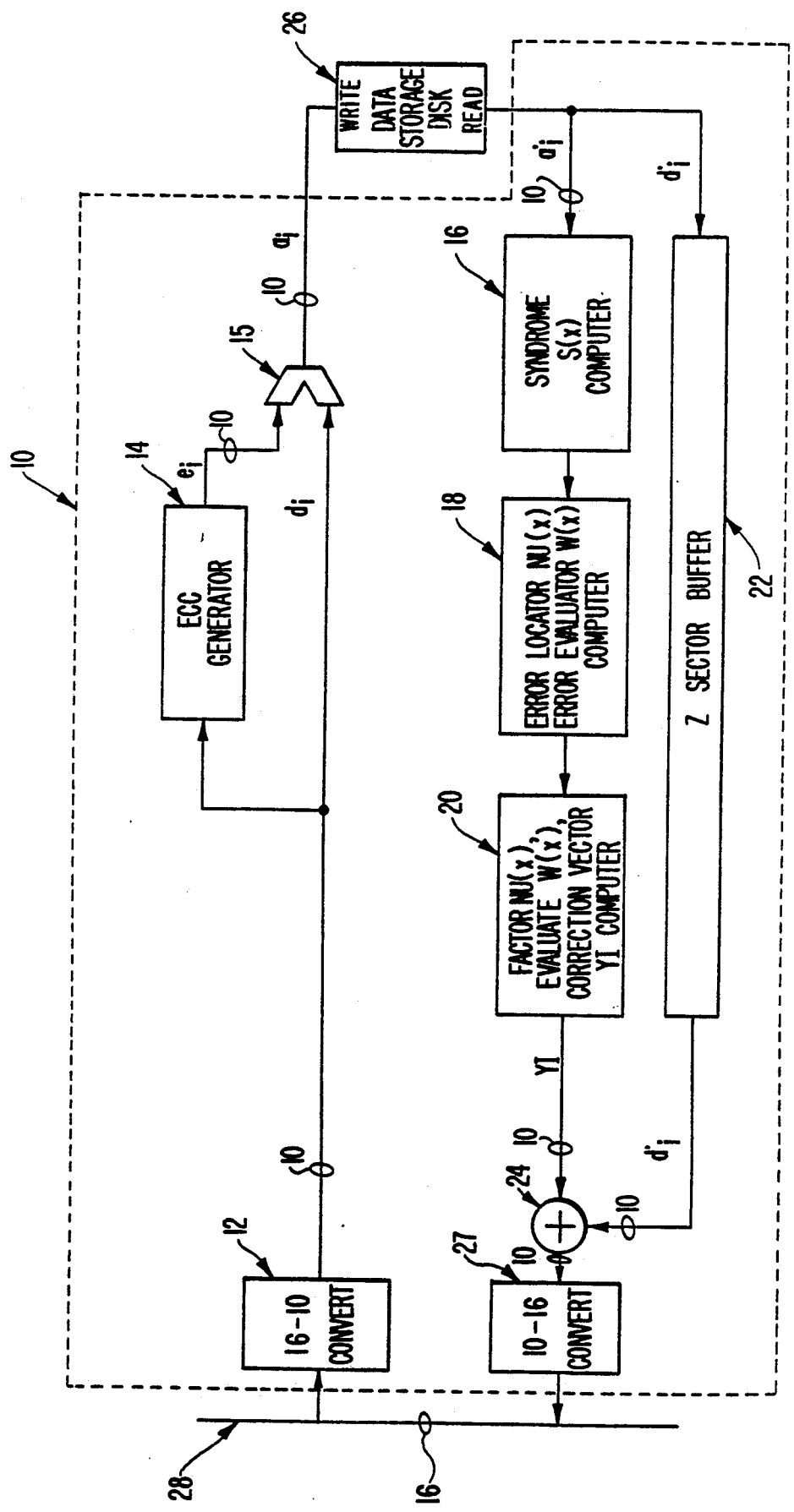
FIG. 1 is a schematic block diagram showing the overall structure of an integrated circuit which constitutes a preferred embodiment of the present invention.

The present preferred embodiment of the Reed-Solomon error detecting and correcting circuit is shown in block diagram form in FIG. 1 and is represented generally by the numeral 10. As embodied herein, circuit 10 accepts binary data from data bus 28 of a data processing system (not shown) and converts those data bits into K m-bit data symbols, $d_i$, where i=1 to K. Data symbols $d_i$ are simultaneously sent to an Error Correction Code (ECC) generator 14 and a data storage disk 26 through a multiplexer 15.

In accordance with the invention, there is provided encoder means for encoding the data symbols into a plurality of Reed-Solomon first code words a(x) and sending the first code words to the error inducing medium. As embodied herein, ECC generator 14 generates N−K ECC symbols $e_i$, where i=0 to N−K−1, using a generator polynomial g(x) having roots $\alpha^i$, −34<i<34, where $\alpha$ is a primitive element of the Galois Field GF($2^m$). N represents the length of the code word and is an integer <$2^m$. The N−K ECC symbols $e_i$ are appended by multiplexer 15 to the K data symbols $d_i$ to create an N symbol Reed-Solomon (N,K) code word a(x), consisting of N symbols $a_i$, which is stored on data storage disk 26. A header field is also provided for each code word which provides separation between code words, and other storage functions, and is not described in detail. Storage device 26 is an example which contains an error inducing medium where errors can be created as data are being stored and retrieved.

Errors may occur to the symbols of code word a(x) when stored on and retrieved from storage device 26. When read from the disk, code word a(x) is designated y(x) because it may contain erroneous symbols. Where there are no errors present, y(x) equals a(x), or equivalently p(x)=0.

In accordance with the invention, there is provided buffer means for receiving from the error inducing medium a plurality of retrieved code words y(x) equal to the first code words in which errors have been induced and for holding each of the retrieved code words long enough to compute error locations and values, preferably for no longer than the time needed to compute error locations and values. As embodied herein, data symbols read from data storage disk 26 are held in a data buffer 22. The invention further includes decoder means for computing from the retrieved code words a plurality of error locations and correction vectors in real time as each symbol of the retrieved code word exits from the buffer means. As herein embodied, the decoding means, including a Syndrome Computer 16, an Error Locator and an Error Evaluator Computer 18, and an Error Correction Vector Computer 20, calculates the error location and correction vector for data symbols being held in buffer 22.

As herein embodied, Syndrome Computer 16 begins calculating syndromes as the code word symbols are read from data storage device 26. Error locator and error evaluator computer 18 computes the error locator polynomial NU(x) by solving the Berlekamp-Massey algorithm using syndromes computed in Syndrome Computer 16. The terms of error evaluator polynomial W(x) are also calculated in computer 18 using the values of NU(x) and syndromes from Syndrome Computer 16.

In accordance with the invention, there is provided correcting means responsive to the error locations and correction vectors for correcting erroneous data symbols as they exit the buffer means. As herein embodied, as each data symbol $d'_i$ is released from buffer 22, computer 20 calculates error locator polynomial NU(x) using a modified Chien search algorithm, and evaluates error evaluator polynomial W(x) to compute a correction vector YI that is exclusive or'd by .XOR. circuit 24 with the data symbol being released from buffer 22. Data symbols of the decoded code word are converted into 16 bit data words by converter 27 and are returned to the data processing device 16 bit data bus 28.

The "pipe-lining" or high speed computation of error values and locations in real time as data are released from buffer 22 is a major factor in achieving the low latency, or low holdup time, which permits the circuit of the present invention to achieve a high bandwidth.

Using VLSI logic to execute a Reed-Solomon error correcting function, the circuit of the preferred embodiment achieves an acceptably low error rate for decoded data from sectorized data storage devices such as magnetic disks, magnetic tapes, and optical disks having high inherent error rates. The circuit provides a high bandwidth of approximately 70 megabits per second and a low latency of about 144 microseconds at peak bandwidth using a standard disk sector size of 480 symbols where up to 32 ten bit symbols may need to be corrected, requiring an overhead of 670 ECC bits. This permits operation of storage devices at a net data density higher than certain earlier data storage systems.

Preferably, and as shown in FIG. 1, binary data bits destined for storage on magnetic disk 26 are received from a data processing system (not shown) via a 16 bit data bus 28. The binary data, which consist of both information words and Error Detecting Code (EDC) words are converted in converter 12 to a series of K symbols, where each symbol is m-bits long. In the preferred embodiment, each symbol is 10 bits long, and K is selectable from 48 to 941 data symbols. The 10 bit symbols are assembled from data words and EDC words, each word being 16 bits long. The 16 bit words are converted to symbols until all data words and EDC words have been converted to ten bit data symbols, represented by $d_i$. Enough fill bits are added to provide complete symbols. Data symbols $d_i$ are sent both to storage disk 26 and ECC generator 14.

As here embodied, the encoder means includes ECC generator 14. ECC symbols $e_i$ which will be used to detect and correct errors in the data symbols $d_i$ are computed by ECC generator 14 using a generator polynomial g(x). The error correction code chosen is a symmetric Reed-Solomon code over the Galois Field $GF(2^{10})$ generated by the primitive polynomial $x^{10}+x^3+1$. For the Reed-Solomon code of the preferred embodiment, the generator polynomial, g(x) is defined as:

EQUATION 1

$$g(x) = \prod_{i=-33}^{+33} (x + \alpha^i),$$

where $\alpha^i$ are elements of $GF(2^{10})$. $GF(2^{10})$ contains 1023 elements, therefore a code word of N=1023 symbols can be generated. Code words in the preferred embodiment are limited to N=115 to 1008 symbols by the design of integrated circuit 10 of FIG. 1. The generator polynomial g(x) is chosen to generate 67 ECC symbols, therefore N−K is 67 which suffices to correct up to 32 symbols in error per sector or code word, provide a 100% probability of detecting all errors up to 35 errors per sector, and provide a strong likelihood of detecting all errors greater than 35 per sector. The polynomial g(x) is so defined that when expanded into its individual terms, it has symmetric coefficients so that the Galois Field multiplier circuits, defined mathematically below, can be reduced by a factor of 2, that is, each $\alpha^i$ term appears twice in g(x) as a coefficient of a different power of x. Equations 2 and 3 are expansions of Equation 1. Equation 3 shows the individual terms of g(x).

EQUATION 2

$$g(x)=(x+\alpha^{-33})(x+\alpha^{-32})\ldots(x+\alpha^{33})$$

EQUATION 3

$$g(x)=x^{67}+\alpha^{35}x^{66}+\alpha^{146}x^{65}+\alpha^{572}x^{64}+\alpha^{47}x^{63}+$$
$$\alpha^{505}x^{62}+\alpha^{950}x^{61}+\alpha^{820}x^{60}+\alpha^{812}x^{59}+\alpha^{177}x^{58}+$$
$$\alpha^{259}x^{57}+\alpha^{530}x^{56}+\alpha^{444}x^{55}+\alpha^{974}x^{54}+\alpha^{349}x^{53}+$$
$$\alpha^{255}x^{52}+\alpha^{261}x^{51}+\alpha^{898}x^{50}+\alpha^{1004}x^{49}+$$
$$\alpha^{496}x^{48}+\alpha^{636}x^{47}+\alpha^{715}x^{46}+\alpha^{475}x^{45}+$$
$$\alpha^{247}x^{44}+\alpha^{957}x^{43}+\alpha^{63}x^{42}+\alpha^{37}x^{41}+\alpha^{673}x^{40}+$$
$$\alpha^{691}x^{39}+\alpha^{598}x^{38}+\alpha^{788}x^{37}+\alpha^{188}x^{36}+$$
$$\alpha^{41}x^{35}+\alpha^{552}x^{34}+\alpha^{552}x^{33}+\alpha^{41}x^{32}+\alpha^{188}x^{31}+$$
$$\alpha^{788}x^{30}+\alpha^{598}x^{29}+\alpha^{691}x^{28}+\alpha^{673}x^{27}+\alpha^{37}x^{26}+$$
$$\alpha^{63}x^{25}+\alpha^{957}x^{24}+\alpha^{247}x^{23}+\alpha^{475}x^{22}+\alpha^{715}x^{21}+$$
$$\alpha^{636}x^{20}+\alpha^{496}x^{19}+\alpha^{1004}x^{18}+\alpha^{898}x^{17}+\alpha^{261}x^{16}+$$
$$\alpha^{255}x^{15}+\alpha^{349}x^{14}+\alpha^{974}x^{13}+\alpha^{444}x^{12}+\alpha^{530}x^{11}+$$
$$\alpha^{259}x^{10}+\alpha^{177}x^9+\alpha^{812}x^8+\alpha^{820}x^7+\alpha^{950}x^6+$$
$$\alpha^{505}x^5+\alpha^{47}x^4+\alpha^{572}x^3+\alpha^{146}x^2+\alpha^{35}x+1$$

Figure 2:
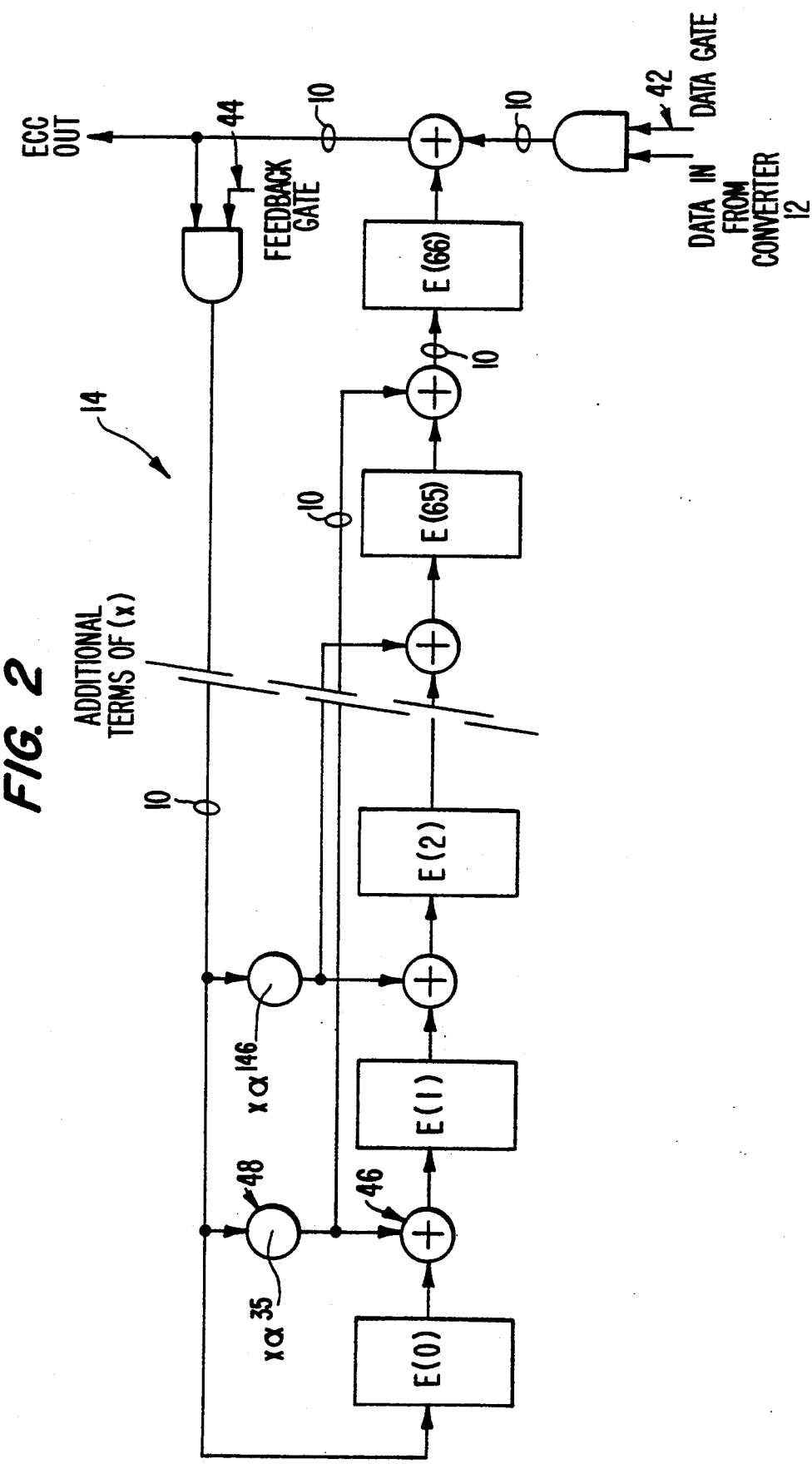
FIG. 2 is an electrical schematic diagram showing the major steps performed by the ECC Generator of the circuit of FIG. 1.

FIG. 2 shows the circuit used by ECC generator 14 to generate the 67 ECC symbols $e_i$ by dividing $d(x)*x^{N-K}$ by g(x), where d(x) is a polynomial of degree K−1 with coefficients equal to $d_i$. Mathematically, the code word a(x) is a polynomial with coefficients $a_i$ and consists of the 67 ECC symbols $e_i$ appended to the data symbols, $d_i$. Note that in the examples which follow, exactly 413 data symbols are chosen. Syndrome modifiers referenced later are based on this choice of 413 data symbols. If a(x) is considered to be a N−1 degree polynomial in x with the symbols $a_i$ as coefficients, then

EQUATION 4

$$a(x)=a_{N-1}x^{N-1}+a_{N-2}x^{N-2}+\ldots+a_1x+a_0$$

The coefficients of the first K terms are $d_i$, and the coefficients of the last N−K or 67 terms of the polynomial are $e_i$. The ECC symbols are generated by dividing $d(x) * x^{N-K}$ by g(x), as shown by the circuit of FIG. 2, which amounts to dividing the incoming data stream $d_i$ by g(x). Circuit 14 includes 67 shift registers, labeled E(0), E(1)...E(66), each of which is preferably a 10 bit parallel shift register, with the number in parentheses being the power of x represented by that register. The data stream of 413 data symbols is read into ECC generator 14 as the data symbols are being sent to disk 26 for storage. The mode of generator 14 is then switched by blocking both the data gate 42 and the feedback gate 44 to transfer ECC symbols out of circuit 14 to be appended to the data symbols. Blocking the feedback gate also clears the ECC generator for the next sector's data. The ⊕ symbols, one of which is labeled 46 in FIG. 2, indicate a parallel .XOR. or modulo-2 add function. The $\left(\times \alpha^i\right)$ symbols, one of which is labeled 48, indicate a Galois Field multiply by $\alpha^i$, which is equivalent to raising the exponent of an input symbol by i, for example, $\alpha^{j*}\alpha^i = \alpha^{i+j}$, where i+j is computed modulo 1023. All GF multiply operations are modulo the primitive polynomial $x^{10}+x^3+1$.

Multiplication on the Galois Field is defined as follows. If p and q are any two 10 bit symbols where each bit is $p_0, p_1, \ldots p_9$ and $q_0, q_1, \ldots q_9$, then the GF multiply function is defined as:

EQUATION 5

$$p \times q = [(p9x^9 + p8x^8 \ldots p0x^0)(q9x^9 + p9x^8 \ldots q0^0)],$$
$$\text{modulo } x^{10} + x^3 + 1$$
$$= x^9[p9(q0 + q7) + p8(q1 + q8) + p7(q2 + q9) +$$
$$p6q3 + p5q4 + p4q5 + p3q6 + p2q7 + p1q8 + p0q9] +$$
$$x^8[p9(q6 + q9) + p8(q0 + q7) + p7(q1 + q8) +$$
$$p6(q2 + q9) + p5q3 + p4q4 + p3q5 + p2q6 + p1q7 +$$
$$p0q8] + x^7[\ldots$$

The coefficients of the remaining terms ($x^7$ to $x^0$) are the normal products of the polynomials, modulo $x^{10}+x^3+1$. Because the elements of p and q are binary digits, coefficients of the form $p_i(q_j+q_k)$ are equivalent to $p_i$ .AND. ($q_j$ .XOR. $q_k$) and may be calculated in hardware in the normal manner. Any product is an .AND. and any addition in parentheses is a modulo-2 addition, or .XOR.

Because the Reed-Solomon code is cyclic, a 67 symbol "coset leader" is .XOR.'d with the 67 ECC symbols as they are shifted out of circuit 14. The coset leader prevents the decoding portion of circuit 10 from misinterpreting and accepting a sector that has improperly been shifted. A shift of bits that have been .XOR.'d with the coset leader causes circuit 10 to interpret all data in that sector as containing >32 errors. During the data read operation, discussed hereinbelow, the 67 ECC symbols as read from the disk sector are again .XOR.'d with the same coset leader symbols, removing them from the ECC symbols and having no effect on further calculations unless the symbols were shifted, and then excessive errors will be generated in accordance with the normal functioning of the decoding circuit.

The coset leader is .XOR.'d to the ECC symbols in the normal manner. The 67 coset leader symbols of the present invention are selected from a code word of a Reed-Solomon code that contains the Reed-Solomon code of the present invention as a subset. As determined by experimentation, the code word from which the coset leader is selected must have no more than 67 non-zero symbols. There is no known method for selecting an optimum coset leader, but the coset leader of the preferred embodiment, shown in Table 1, will result in 33 or more errors if the symbols of the code word are shifted by up to 100 bits. Starting with the last symbol, the coset leader symbols in octal are:

TABLE 1

| Symbol No. | Value |
|---|---|
| 0 | 404 |
| 1 | 1245 |
| 2 | 1026 |
| 3 | 722 |
| 4 | 1347 |
| 5 | 1147 |
| 6 | 245 |

TABLE 1-continued

| Symbol No. | Value |
|---|---|
| 7 | 1140 |
| 8 | 457 |
| 9 | 560 |
| 10 | 164 |
| 11 | 1407 |
| 12 | 1647 |
| 13 | 362 |
| 14 | 326 |
| 15 | 401 |
| 16 | 567 |
| 17 | 314 |
| 18 | 1532 |
| 19 | 1142 |
| 20 | 707 |
| 21 | 424 |
| 22 | 665 |
| 23 | 324 |
| 24 | 1722 |
| 25 | 1413 |
| 26 | 1002 |
| 27 | 777 |
| 28 | 1370 |
| 29 | 1526 |
| 30 | 471 |
| 31 | 1626 |
| 32 | 573 |
| 33 | 402 |
| 34 | 1562 |
| 35 | 743 |
| 36 | 421 |
| 37 | 1230 |
| 38 | 55 |
| 39 | 1453 |
| 40 | 233 |
| 41 | 257 |
| 42 | 665 |
| 43 | 1525 |
| 44 | 1415 |
| 45 | 1301 |
| 46 | 1125 |
| 47 | 1401 |
| 48 | 402 |
| 49 | 1564 |
| 50 | 1604 |
| 51 | 627 |
| 52 | 776 |
| 53 | 1275 |
| 54 | 135 |
| 55 | 501 |
| 56 | 42 |
| 57 | 410 |
| 58 | 1632 |
| 59 | 1313 |
| 60 | 1223 |
| 61 | 531 |
| 62 | 1745 |
| 63 | 1442 |
| 64 | 777 |
| 65 | 1632 |
| 66 | 630 |

Figure 3:
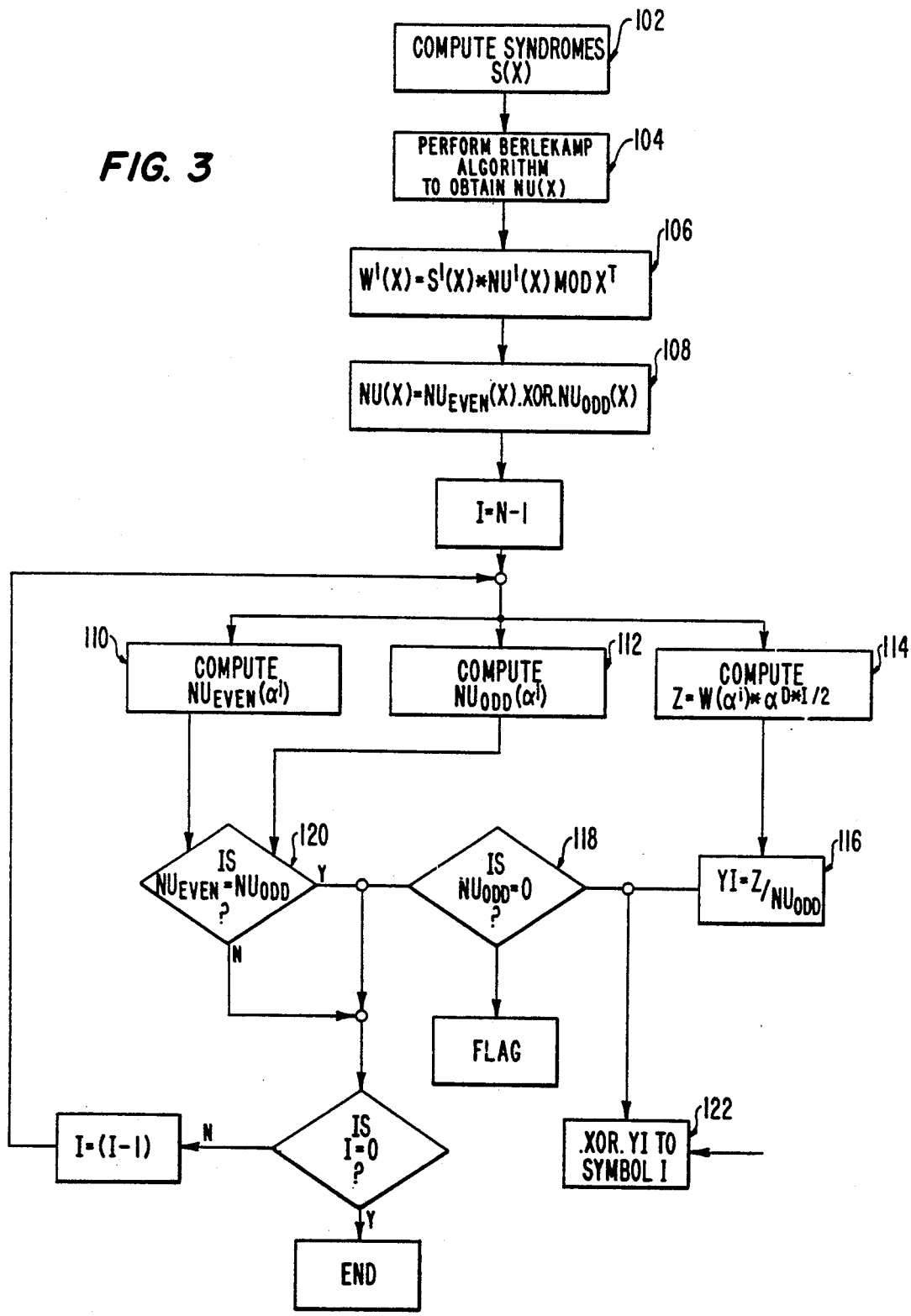
FIG. 3 is a flow chart of the decoding process performed by the syndrome computer, the error locator NU(X) and error evaluator W(x) computer, and the factor NU(x), evaluate W(x), and correction vector YI computer circuits of FIG. 1.

After a varying amount of data storage time determined by the disk user, code word y(x) is read from disk 26. Because of possible errors in code word symbols, a(x) is now represented by y(x). If there are no errors in y(x), then a(x)=y(x). The flow chart of FIG. 3 shows the sequence of events performed by the decoder portion of circuit 10 which includes syndrome generating means, step 102; the means for calculating error locator polynomial NU(x), step 104, and error evaluator polynomial W(x), step 106; and means for simultaneously calculating the value of the error locator polynomial NU(x), steps 108, 110, and 112, and the value of the error evaluator polynomial W(x), step 114, and means for correcting erroneous symbols in code word y(x) to error free symbols $a_i$ in real time as each root of NU(x) and value of W(x) is calculated, steps 116, 118, 120 and 122. On FIG. 3, N represents the code length in symbols and I represents the symbol number.

Figure 4:
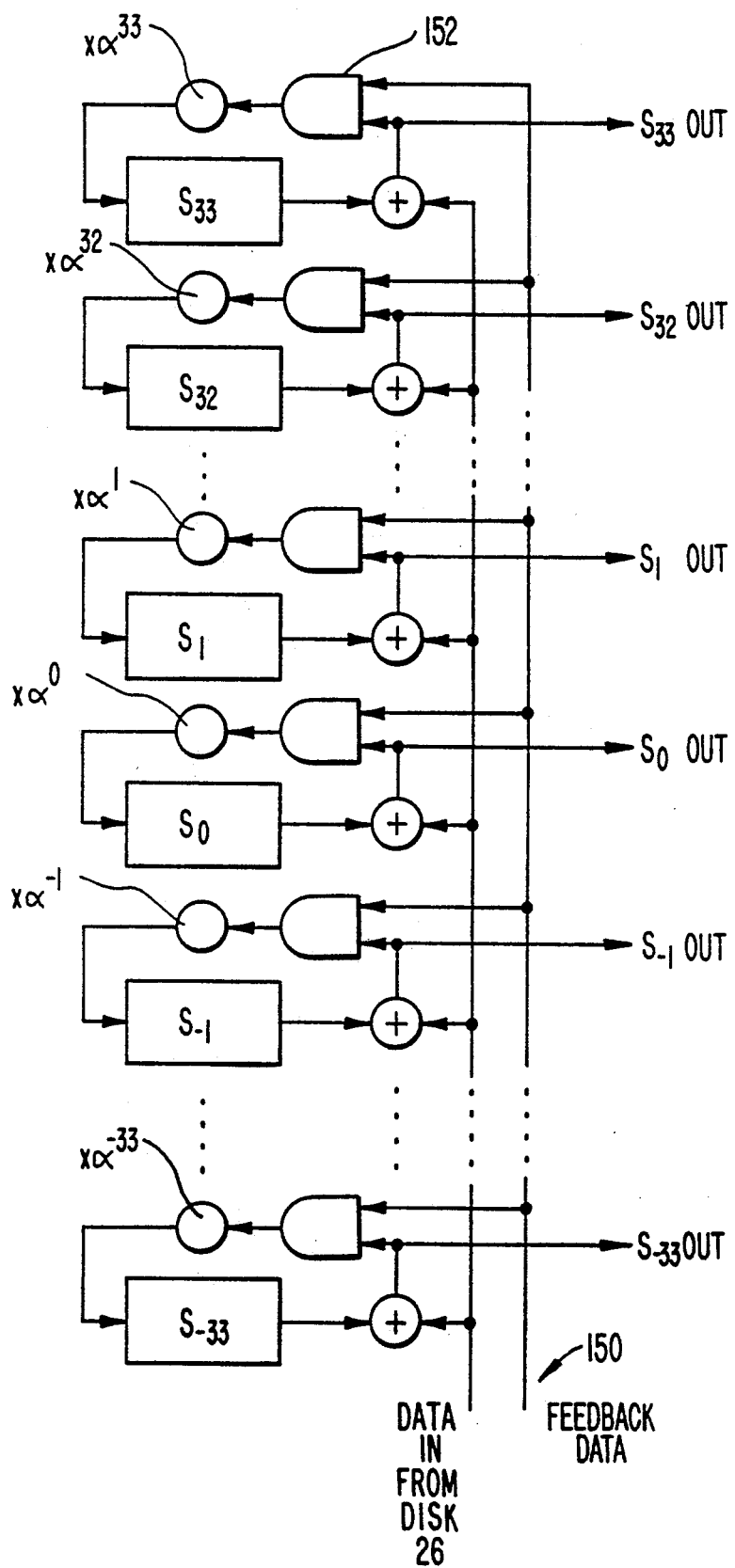
FIG. 4 is an electrical schematic diagram of the Syndrome Compute circuit, part of the Syndrome Computer block 16 of the circuit of FIG. 1 and part of step 102 of the flowchart of FIG. 3.

Syndrome computer 16 of FIG. 1 generates syndromes $S_j$, step 102 of FIG. 3, which are the coefficients of a polynomial S(x). FIG. 4 shows the circuit used to compute S(x) simultaneously as the symbols of code word y(x) are read from a sector of disk 26. The calculation being performed by the circuit of FIG. 4 is:

EQUATION 6

$$S_j = \sum_{i=0}^{N-1} y_i \, x \, \alpha^{ij} \quad \text{for } -34 < j < 34$$

The calculation is performed by a Galois Field multiplier means consisting of an array of 10 bit wide registers, labeled $S_{33}$ to $S_{-33}$, GF multipliers, adders, and .AND. gates, each of which is an S computer. As in FIG. 2, $(x\alpha^i)$ symbols indicate a GF multiply operation, and $\oplus$ symbols indicate a modulo-2 addition, or .XOR. A mode switch occurs by deasserting feedback gate 150 after 479 symbols have been transferred into all 67 S computers, at which point all 67 .AND. gates, one of which is identified as 152, are blocked and the 480th symbol is simultaneously entered into the 67 S computers. Blocking feedback gate 150 clears all S computers in preparation for calculating syndromes for the next sector.

In a second preferred embodiment a substantial reduction in hardware was achieved by making the Galois Field multiplier means of the syndrome computer of FIG. 4 operate on a half symbol clock (70 ns.) even though it accepts input symbols at half that rate. This allows a hardware savings because each multiplier can be used twice in a full symbol period to generate two partial syndromes, therefore only 34 of the 67 alpha multipliers need be built. Each adjacent multiplier is related by a simple function. As an example, $\alpha^{-32}$ can be derived by taking $\alpha^{-33}$ and multiplying it by $\alpha^1$ ($-33+1=-32$). Multiplying by $\alpha^1$ is equivalent to shifting once and XORing bit 9 with bit 2.

Given a 10 bit symbol 9 8 7 6 5 4 3 2 1 0, this symbol multiplied by $\alpha^1$ would become 8 7 6 5 4 3 9.XOR.2 1 0 9. This is a much simpler and smaller function to build than an $\alpha^{-32}$ multiplier. All even numbered alpha multipliers in the syndrome computer are derived from the odd numbered alpha multipliers in this manner. This same hardware reduction technique is also used in the YI computer 20 of FIG. 1, and will be discussed in greater detail hereinbelow.

Figure 5:
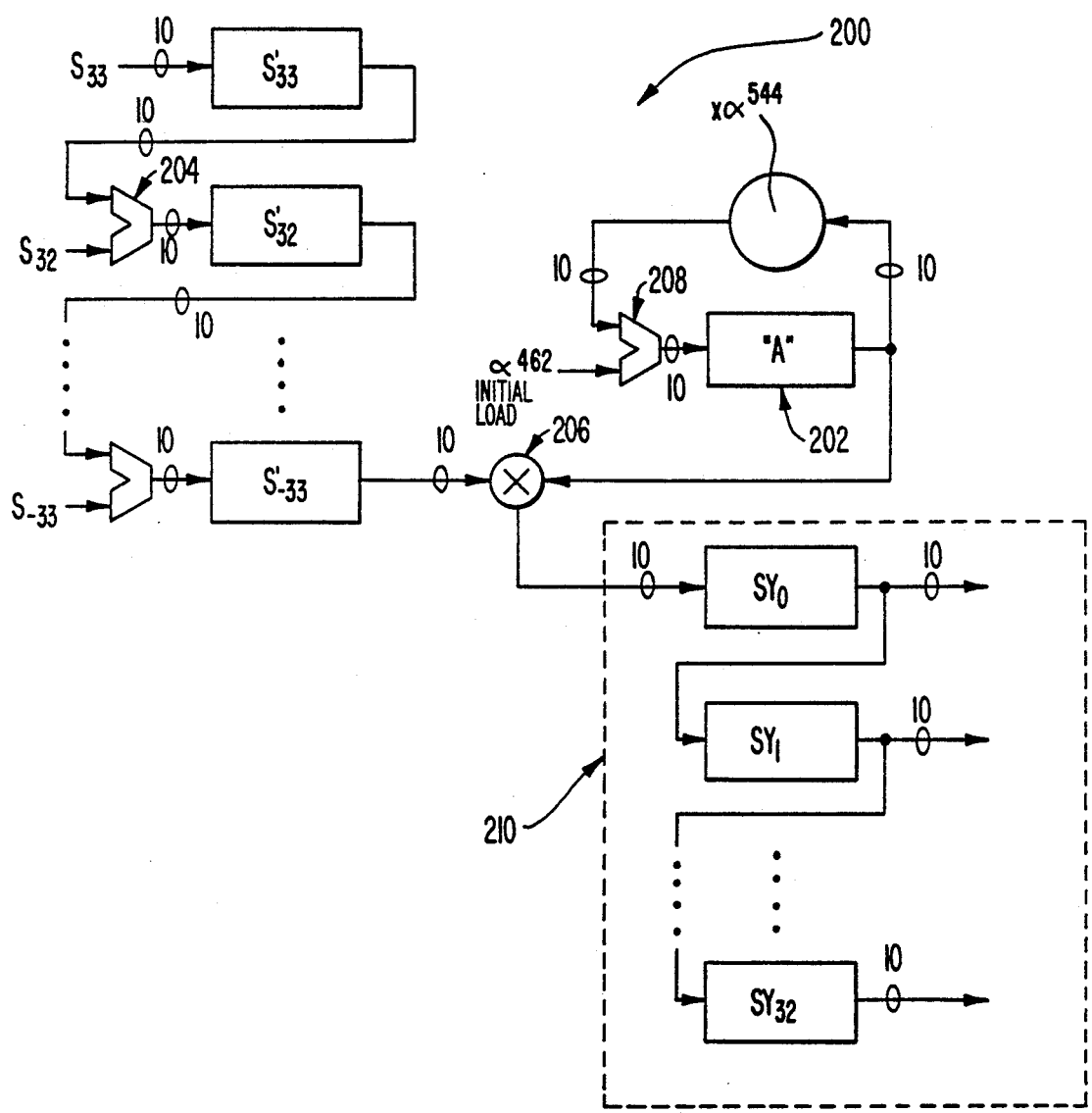
FIG. 5 is an electrical schematic diagram of part of the Amend Syndrome Compute circuit, another part of the Syndrome Compute block 16 of the circuit of FIG. 1 and part of step 102 of the flowchart of FIG. 3.

The 67 syndrome values $S_i$ are next passed to the S'(K) registers of amend syndrome circuit 200 of FIG. 5. Except for syndrome value $S_{33}$, syndrome values are input through multiplexers, one of which is identified by the numeral 204. This releases the S calculator circuit of FIG. 4 to calculate syndromes for the next code word to be read. Circuit 200 is also part of syndrome generator 16 of FIG. 1. The amend syndrome function shortens the code symbols of $GF(2^{10})$ from a maximum of 1023 symbols to the 480 symbols used in the example and stores the amend syndromes for the shortened code in the SY registers, 210 of FIG. 5. Amend syndrome computation starts with a broadside load of the 67 syndromes, S(K), into S'(K) registers, labeled S'(−33) to S'(33). Simultaneously, register 202 is cleared and loaded with the value of $\alpha^{462}$, which is equal to 0001010101. Multiplexers connected to S'(K) registers isolate the S(K) input and connect each S'(K) register to the next higher S'(K−1) register. The first multiplication to take place in GF multiplier 206 is S(−33) $(x\alpha^{462})$ which is then shifted into shift register SY(0). Multiplexer 208 isolates the $\alpha^{462}$ signal from register 202 and aligns the GF $(x\alpha^{544})$ multiplier so that when syndrome S(−32) is shifted into register S'(−33) it will be multiplied by the contents of register 202 which is the GF product of $\alpha^{462}$ and $\alpha^{544}$. Each amend syndrome in register SY(K) is therefore the GF product of the syndrome value from the S'(K) register multiplied by $(\alpha^{462})(\alpha^{544})^{n-1}$. The $(x\alpha^{544})$ function is the same GF multiplication defined by Equation 5, but may be implemented by the following .XOR. operations, where $O_i$ are the output bits of a 10 bit symbol, and $I_i$ are the input bits.

TABLE 2

$O_9 = I_0 \oplus I_1 \oplus I_2 \oplus I_3 \oplus I_5 \oplus I_6$
$O_8 = I_0 \oplus I_1 \oplus I_2 \oplus I_4 \oplus I_5$
$O_7 = I_0 \oplus I_1 \oplus I_3 \oplus I_4 \oplus I_9$
$O_6 = I_0 \oplus I_2 \oplus I_3 \oplus I_8$
$O_5 = I_1 \oplus I_2 \oplus I_7$
$O_4 = I_0 \oplus I_1 \oplus I_6$
$O_3 = I_0 \oplus I_5 \oplus I_9$
$O_2 = I_0 \oplus I_1 \oplus I_2 \oplus I_3 \oplus I_4 \oplus I_5 \oplus I_6 \oplus I_8 \oplus I_9$
$O_1 = I_0 \oplus I_1 \oplus I_2 \oplus I_3 \oplus I_4 \oplus I_5 \oplus I_7 \oplus I_8$
$O_0 = I_0 \oplus I_1 \oplus I_2 \oplus I_3 \oplus I_4 \oplus I_6 \oplus I_7$ The $\alpha^{462}$ and $\alpha^{544}$ multipliers of circuit 200 are programmable in the circuit of the preferred embodiment and must be changed if the code word length is altered from 480 symbols.

The means for generating the NU(x) error locator polynomial is shown in FIG. 1 as circuit 18. Amend syndromes, SY(K) are now used to compute NU(x) using the Berlekamp-Massey algorithm, as modified by Weng, and using a data flow technique as suggested by Riggle to increase processing speed, step 104 of FIG. 3, and shown more completely as the flow chart of FIG. 6.

Figure 6:
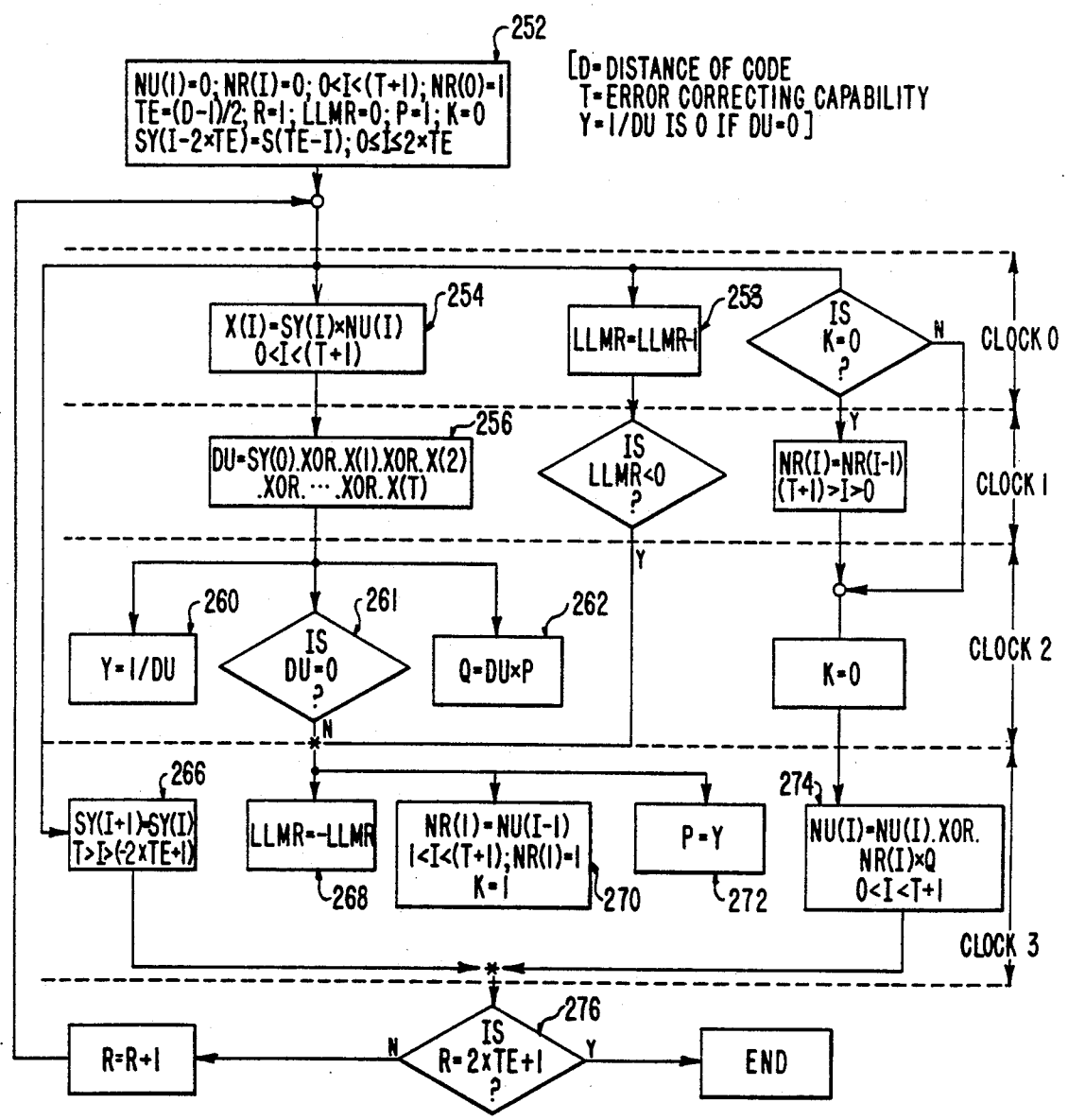
FIG. 6 is a flowchart of the computation of the error locator polynomial NU(x), step 104 of FIG. 3 and part of the Compute Error Locator NU(x), Error Evaluator W(x) circuit 18 of FIG. 1.

The flow chart of FIG. 6 shows the individual steps performed during the calculation of NU(x). FIG. 6 is broken down into sections by clock cycles or states, described in more detail hereinbelow, to show operations performed simultaneously. For the sake of clarity, quantities calculated in one section of the chart are made available to other boxes in the chart, but connecting lines are not shown.

Figure 7:
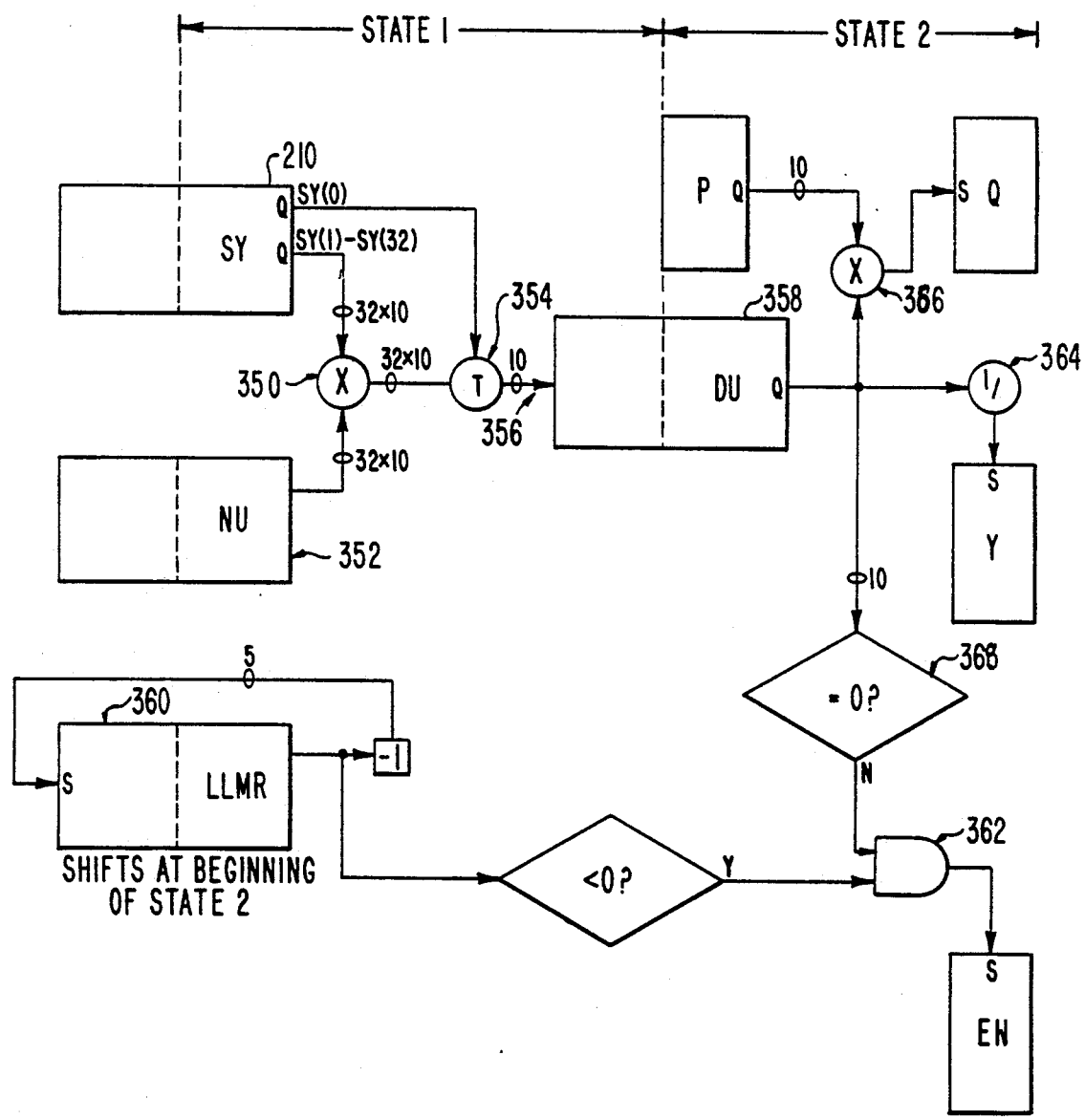
FIG. 7 is an electrical schematic diagram of the execution of Berlekamp's algorithm as shown in the flowchart of FIG. 6.

The initial conditions for FIG. 6 are shown in step 252. The quantity D in step 252 is the integer value of the code distance, N−K+1=68. The quantity Y, calculated in step 260, is defined to be 0 when DU=0. A state machine (not shown) controls the process steps which are repeated 67 times. Referring also to FIG. 7, during state 1, multiplexers (not shown) connect 32 symbol wide GF multiplier 350 to 32 SY registers 210 (SY(1)−SY(32)) and 32 NU registers 352. The GF product is performed as defined by Equation 5 on the NU and SY registers. This completes step 254 of FIG. 6. The product, X(I) of FIG. 6, is shifted to not-shift registers (not shown), and is exclusive OR'd in tree fashion with SY(0) by the $(+_T)$ function 354 of FIG. 7 until a single 10 bit symbol, DU, appears on 10 bit bus 356. This completes step 256 of FIG. 6. The $(+_T)$ function is the concatenated .XOR. sum of all inputs. If there are n inputs $I_j$, then the output $O=I_0 \oplus I_1 \ldots \oplus I_n$. For maximum speed the .XOR.'s are treed as shown below.

TABLE 3

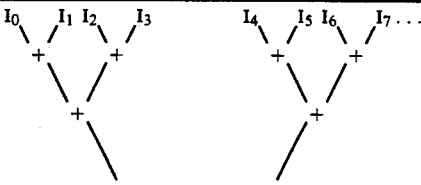

Figure 8:
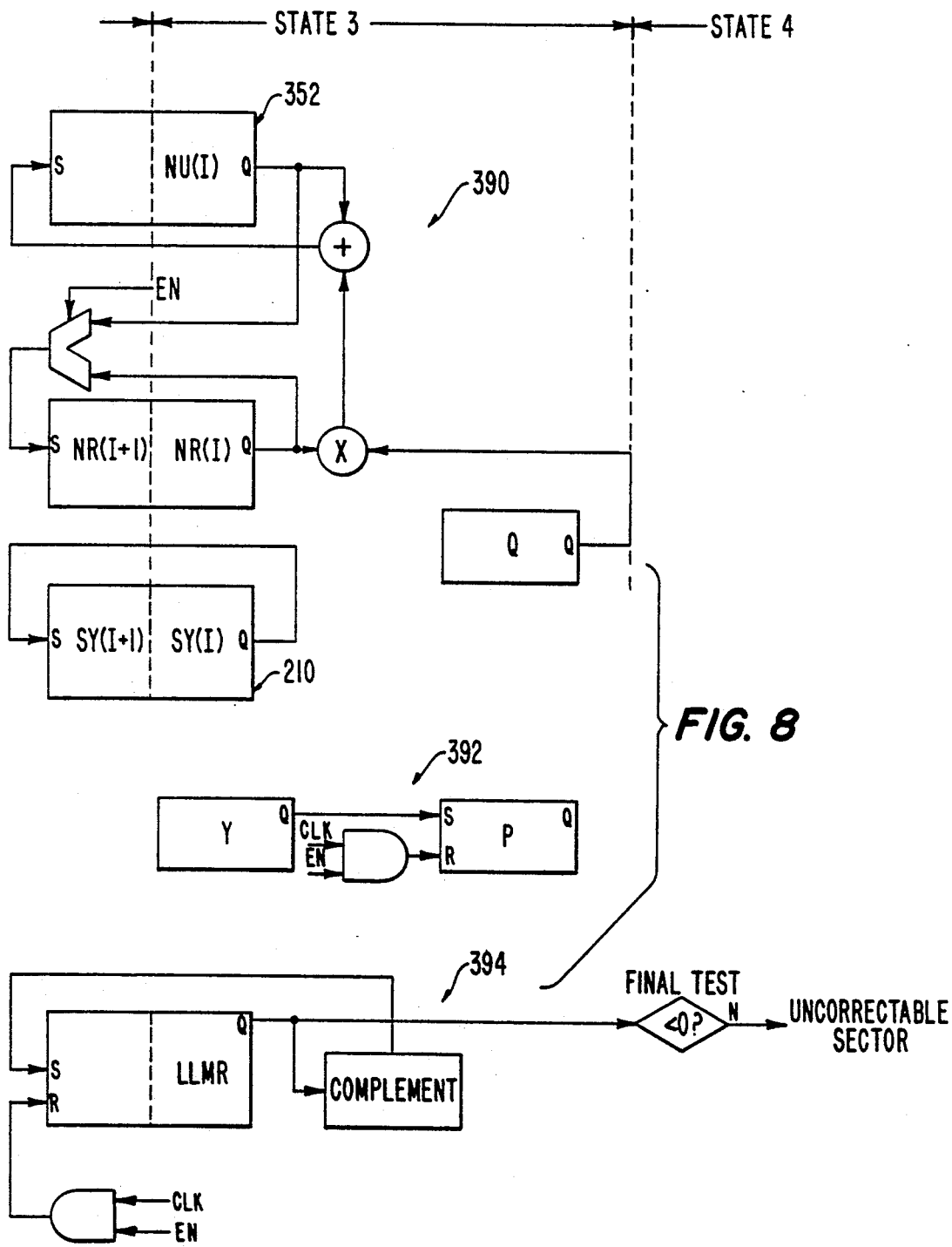
FIG. 8 is an electrical schematic diagram of the remaining part of the execution of Berlekamp's algorithm as shown in the flowchart of FIG. 6.

During state 1, the single 10 bit symbol is clocked into DU registers 358 and is clocked to the output stage of registers 358 during state 2. Simultaneously, as shown in step 258 of FIG. 6, the counting register 360 of FIG. 7 containing counter variable LLMR is decremented by 1 and tested for a condition of being less than 0. If less than 0, gate 362 is enabled. As shown in step 260 of FIG. 6, during state 2 the value of DU in shift register 358 of FIG. 7 is shifted to the output and is used to (1) compute a new value of Y by an inversion process 364 of FIG. 7, described hereinbelow, (2) compute a new value of $Q=DU \otimes P$, step 262 of FIG. 6 performed by GF multiplier 366 of FIG. 7, and (3) test for DU=0, logic test 368 of FIG. 7 and step 264 of FIG. 6. If DU=0 and LLMR<0 then EN is set as a flag via gate 362. Inversion operation 364 is performed according to a procedure developed by Lih-Jyh Weng, and is shown in FIG. 8.

Figure 9:
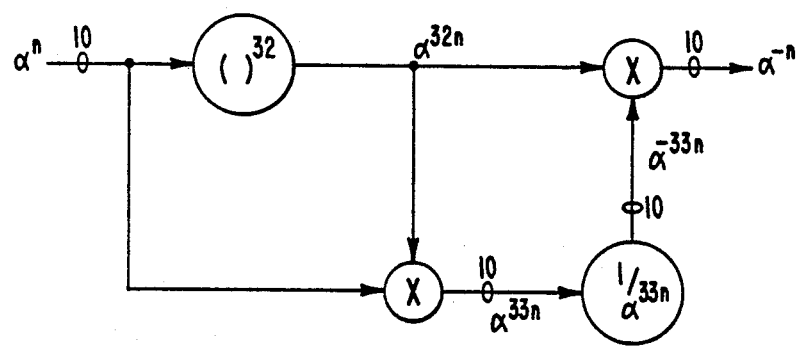
FIG. 9 is an electrical schematic diagram of a Galois Field combinational inverse calculator, which is circuit 364 of FIG. 7.

The GF inverse circuit 364 of FIG. 7 is shown in more detail in FIG. 9. The circuit of FIG. 9 computes the inverse $\alpha^{-n}$ of an input symbol $\alpha^n$ by raising the input symbol to the 32 power and multiplying it by the input symbol lowered to the $-33$ power. The result of $\alpha^{32n} \times \alpha^{-33n}$ is $\alpha^{-n}$. To accomplish this a 10 bit symbol $\alpha^n$ is input to an $\alpha^{32}$ .XOR. network 400, with bit inputs $I_i$ and bit outputs $O_i$ as shown below:

TABLE 4

| |
|---|
| $O_9 = I_2 \oplus I_3 \oplus I_4 \oplus I_9$ |
| $O_8 = I_1 \oplus I_2 \oplus I_5 \oplus I_6 \oplus I_7 \oplus I_8 \oplus I_9$ |
| $O_7 = I_7$ |
| $O_6 = I_2 \oplus I_3 \oplus I_5$ |
| $O_5 = I_1 \oplus I_3 \oplus I_4 \oplus I_6 \oplus I_7 \oplus I_9$ |
| $O_4 = I_1 \oplus I_2 \oplus I_7 \oplus I_9$ |
| $O_3 = I_2 \oplus I_6 \oplus I_7 \oplus I_8 \oplus I_9$ |
| $O_2 = I_1 \oplus I_2 \oplus I_3 \oplus I_4 \oplus I_6 \oplus I_8$ |
| $O_1 = I_1 \oplus I_4 \oplus I_6 \oplus I_7 \oplus I_8 \oplus I_9$ |
| $O_0 = I_0 \oplus I_2 \oplus I_3 \oplus I_4 \oplus I_7$ |

Each $\oplus$ represents an .XOR. The value $\alpha^{32n}$ is multiplied by $\alpha^n$ to get $\alpha^{33n}$. Because $\alpha^{33n}$ are elements of a subfield, $GF(2^5)$, of $GF(2^{10})$, there are only 31 possible non-zero values for any $\alpha^{33n}$. Using a selected 5 of the 10 bits available ($I_0, I_1, I_2, I_3, I_5$), it is possible to construct a logic network as defined by Table 5 below which outputs the 31 inverses of $\alpha^{33n}$ (i.e., all $\alpha^{-33n}$). $O_i$ are the output bits of the $\alpha^{-33n}$ network that are computed from the input bits $I_j$. The input bits are the 10 bits of the symbol $\alpha^{33n}$ and the output bits are the 10 bits of the symbol $\alpha^{-33n}$.

TABLE 5

$O_9 = Z_1 + Z_5 + Z_6 + Z_7 + Z_9 + Z_{10} + Z_{11} + Z_{12} + Z_{13} + Z_{16} + Z_{19} + Z_{20} + Z_{25} + Z_{27} + Z_{28} + Z_{30}$ $O_8 = Z_3 + Z_5 + Z_6 + Z_8 + Z_{10} + Z_{14} + Z_{15} + Z_{16} + Z_{18} + Z_{19} + Z_{20} + Z_{21} + Z_{22} + Z_{25} + Z_{28} + Z_{29}$ $O_7 = 0$ $O_6 = Z_4 + Z_6 + Z_7 + Z_9 + Z_{11} + Z_{15} + Z_{16} + Z_{17} + Z_{19} + Z_{20} + Z_{21} + Z_{22} + Z_{23} + Z_{26} + Z_{29} + Z_{30}$ $O_5 = Z_1 + Z_3 + Z_7 + Z_8 + Z_9 + Z_{11} + Z_{12} + Z_{13} + Z_{14} + Z_{15} + Z_{18} + Z_{21} + Z_{22} + Z_{27} + Z_{29} + Z_{30}$ $O_4 = Z_1 + Z_3 + Z_4 + Z_6 + Z_8 + Z_{12} + Z_{13} + Z_{14} + Z_{16} + Z_{17} + Z_{18} + Z_{19} + Z_{20} + Z_{23} + Z_{26} + Z_{27}$ $O_3 = Z_2 + Z_5 + Z_6 + Z_{11} + Z_{13} + Z_{14} + Z_{16} + Z_{18} + Z_{22} + Z_{23} + Z_{24} + Z_{26} + Z_{27} + Z_{28} + Z_{29} + Z_{30}$ $O_2 = Z_1 + Z_2 + Z_3 + Z_4 + Z_5 + Z_8 + Z_{11} + Z_{12} + Z_{17} + Z_{19} + Z_{20} + Z_{22} + Z_{24} + Z_{28} + Z_{29} + Z_{30}$ $O_1 = Z_1 + Z_2 + Z_7 + Z_9 + Z_{10} + Z_{12} + Z_{14} + Z_{18} + Z_{19} + Z_{20} + Z_{22} + Z_{23} + Z_{24} + Z_{25} + Z_{26} + Z_{29}$ $O_0 = Z_0 + Z_1 + Z_3 + Z_5 + Z_9 + Z_{10} + Z_{11} + Z_{13} + Z_{14} + Z_{15} + Z_{16} + Z_{17} + Z_{20} + Z_{23} + Z_{24} + Z_{29}$

| | | |
|---|---|---|
| $Z_0 = \bar{I_0}\bar{I_1}\bar{I_2}\bar{I_3}\bar{I_5}$ | $Z_1 = I_0\bar{I_1}\bar{I_2}\bar{I_3}\bar{I_5}$ | $Z_2 = \bar{I_0}I_1\bar{I_2}\bar{I_3}\bar{I_5}$ |
| $Z_3 = I_0I_1\bar{I_2}\bar{I_3}\bar{I_5}$ | $Z_4 = \bar{I_0}\bar{I_1}I_2\bar{I_3}\bar{I_5}$ | $Z_5 = I_0\bar{I_1}I_2\bar{I_3}\bar{I_5}$ |
| $Z_6 = \bar{I_0}I_1I_2\bar{I_3}\bar{I_5}$ | $Z_7 = I_0I_1I_2\bar{I_3}\bar{I_5}$ | $Z_8 = \bar{I_0}\bar{I_1}\bar{I_2}I_3\bar{I_5}$ |
| $Z_9 = \bar{I_0}I_1\bar{I_2}I_3\bar{I_5}$ | $Z_{10} = \bar{I_0}I_1\bar{I_2}I_3\bar{I_5}$ | $Z_{11} = I_0I_1\bar{I_2}I_3\bar{I_5}$ |
| $Z_{12} = \bar{I_0}\bar{I_1}I_2I_3\bar{I_5}$ | $Z_{13} = \bar{I_0}I_1I_2I_3\bar{I_5}$ | $Z_{14} = I_0\bar{I_1}I_2I_3\bar{I_5}$ |
| $Z_{15} = I_0\bar{I_1}I_2I_3\bar{I_5}$ | $Z_{16} = I_0I_1I_2I_3\bar{I_5}$ | $Z_{17} = I_0I_1I_2I_3\bar{I_5}$ |
| $Z_{18} = I_0I_1I_2I_3I_5$ | $Z_{19} = \bar{I_0}\bar{I_1}\bar{I_2}\bar{I_3}I_5$ | $Z_{20} = I_0\bar{I_1}\bar{I_2}\bar{I_3}I_5$ |
| $Z_{21} = \bar{I_0}I_1\bar{I_2}\bar{I_3}I_5$ | $Z_{22} = I_0I_1\bar{I_2}\bar{I_3}I_5$ | $Z_{23} = \bar{I_0}\bar{I_1}I_2\bar{I_3}I_5$ |
| $Z_{24} = I_0\bar{I_1}I_2\bar{I_3}I_5$ | $Z_{25} = \bar{I_0}I_1I_2\bar{I_3}I_5$ | $Z_{26} = I_0I_1I_2\bar{I_3}I_5$ |
| $Z_{27} = \bar{I_0}\bar{I_1}\bar{I_2}I_3I_5$ | $Z_{28} = I_0\bar{I_1}I_2I_3I_5$ | $Z_{29} = \bar{I_0}I_1\bar{I_2}I_3I_5$ |
| $Z_{30} = I_0I_1I_2\bar{I_3}I_5$ | | |

The final operation to invert $\alpha^n$ is to multiply $\alpha^{32n}$ by $\alpha^{-33n}$ to yield $\alpha^{-n}$ according to equation 5, presented earlier.

If EN is set, during state 3 LLMR has its sign bit complemented, step 268 of FIG. 6, NR input contents are replaced by NU contents, step 270, and the value of P is replaced by the value of Y. If EN is not set, then NR is shifted upwards (towards higher order terms).

Also during state 3, NU input contents are replaced with the NU outputs .XOR.'d with NR$\otimes$Q, step 274 of FIG. 6, and SY registers are shifted upwards, step 266. When this has been completed, one of 67 loops has been completed as counted by R in step 276 of FIG. 6. During the 67th loop, the SY register shift is omitted to prepare for the W(x) computation. A test of LLMR is made during each loop to assure that LLMR is <0. If it is not, then there are more than 32=T errors in the code word and the sector is not correctable. After all 67 steps have been performed, the final NU(I) are coefficients of the error locator polynomial NU(x) for $0<I<(T+1)$, and NU(0)=1.

Figure 10:
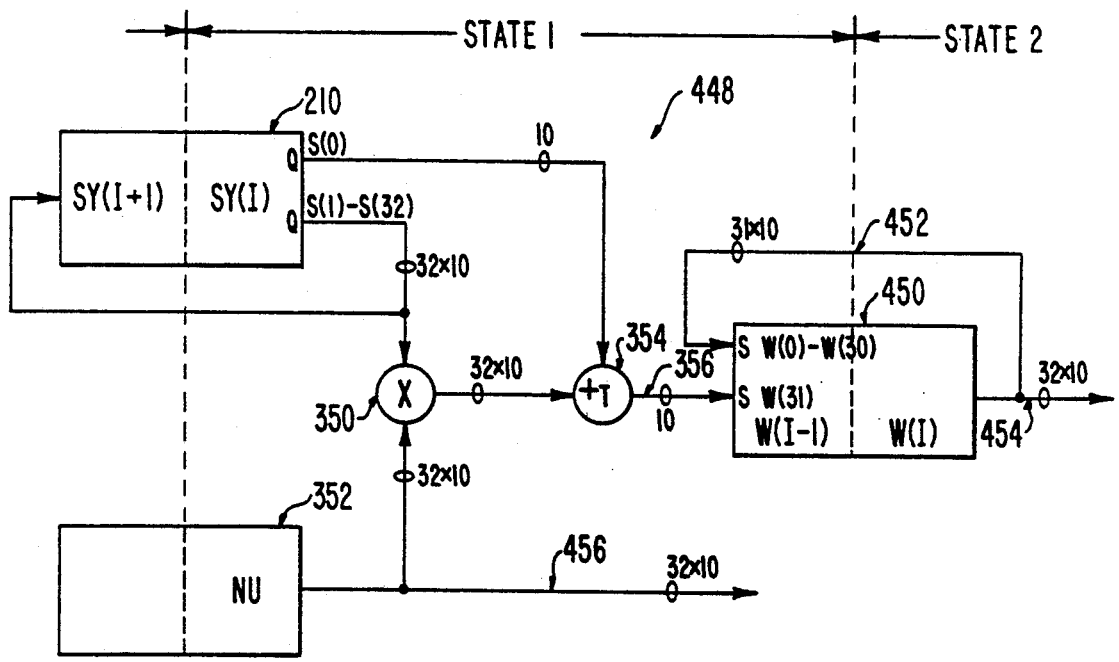
FIG. 10 is an electrical schematic diagram of the circuit that computes the error evaluator polynomial W(x), namely step 106 of FIG. 3.

Circuit 448 of FIG. 10 includes means for calculating error evaluator polynomial W(x). As embodied herein, the means for computing the values of error evaluator polynomial W(x) comprises w registers 450, amend syndrome 54 registers 210, error locator polynomial NV registers 352, multiplier 350, and treed adder 354 which executes the procedure shown in FIG. 3, including, specifically step 106. For simplicity, the calculation is shown in step 106 in an inverse form. The coefficients of W'(x) are the coefficients of W(x) only in reversed order. To illustrate:

EQUATION 7

If $$p(x)=p_o+p_1X+p_2X^2+\ldots p_kX^k$$

then $$p'(x)=p_k+p_{k-1}X+p_{k-2}X^2+\ldots p_oX^k$$

The same is true for S'(x) and NU'(x). The mode of the NU(x) computer changes to a W(x) computer mode, shown in FIG. 10. Multiplexers (not shown) are set to connect NU registers 352 and SY registers 210 to GF multiplier 350 and tree'd .XOR. function 354 throughout computation of W(x). Ten bit bus 356 is connected to register W(31) of W(I) shift registers 450.

Starting with a new state 1, the products of SY and NU are multiplied by GF multiplier 350 and are tree .XOR.'d by device 354, the operation of which have both been described hereinabove. A single 10 bit symbol is input to register W(31) from bus 356. During state 2, the contents of all W(I) registers are input to all W(I−1) registers via 32 ten bit symbol busses 452 (downshifting the W values) and all SY(I) values are shifted to SY(I+1) (upshifting the SY(I) values). States 1 and 2 are repeated until 32 cycles have been completed. The contents of W(I) registers 450 contain the coefficients of error evaluator polynomial W(x) and the NU(I) registers 352 contain the coefficients of the error locator polynomial NU(x). NU(I) and W(I) values are then transferred to the next functions, step 108, 110, 112, and 114 of FIG. 3. Registers 210, 352, and 450 are cleared in preparation for computing NU(x) and W(x) for the next code word.

Figure 13:
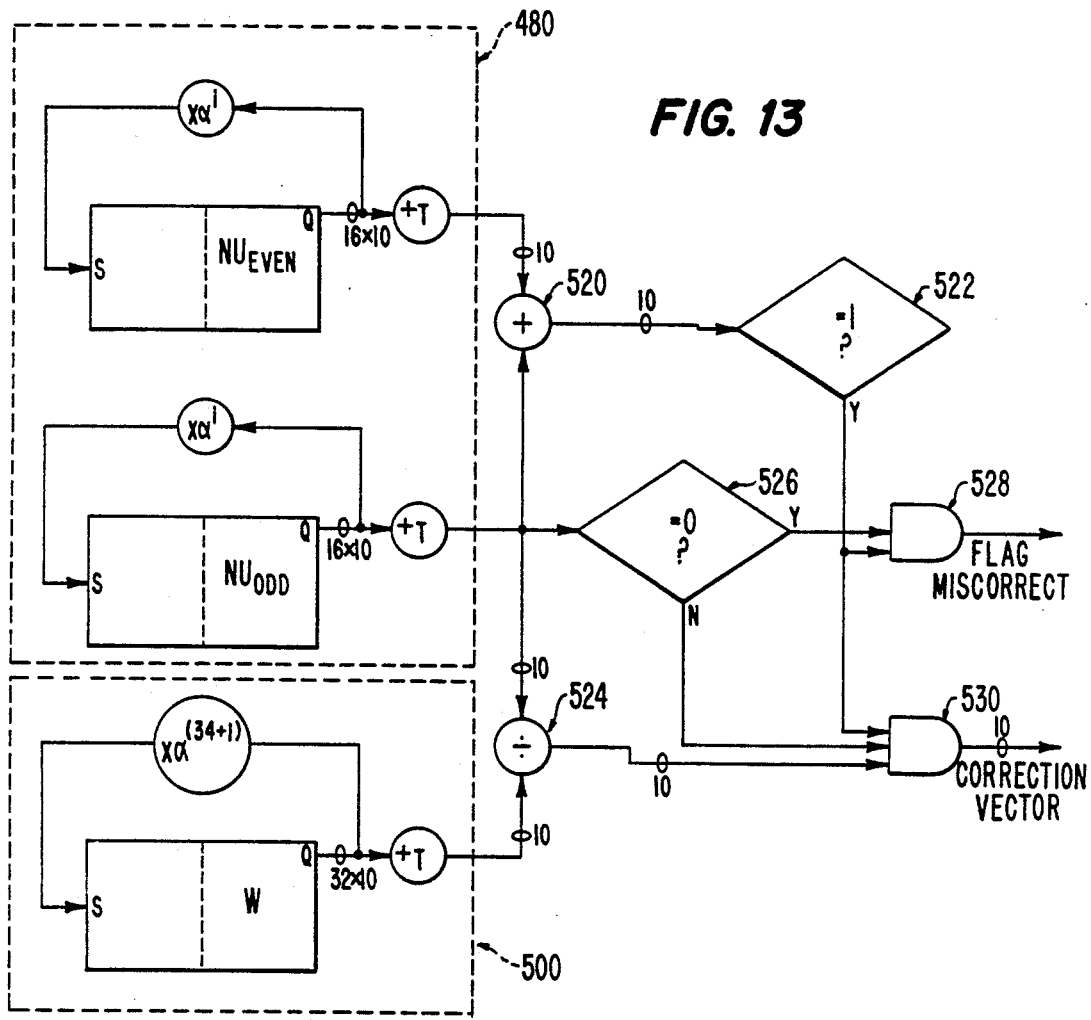
FIG. 13 is an electrical schematic diagram of the circuit that computes the error locations and correction vectors of code word symbols in real time, comprising the circuits of FIGS. 11 and 12, and also including steps 116, 118, and 120 of FIG. 3.

The circuits of FIG. 13 provide the means for simultaneously solving the error locator polynomial NU(x), for obtaining the corresponding error value from NU(x) and W(x), and for correcting erroneous symbols in code word y(x) to error free symbols $a_i$ as each symbol is shifted out of buffer 22 of FIG. 1, which includes the steps of (1) solving each term of NU(x), summing the odd and even power terms into $NU_{odd}(x)$ and $NU_{even}(x)$ respectively, step 108 of FIG. 3, (2) simultaneously evaluating W(x), and (3) correcting errors in y(x) as indicated by the error locations and error values derived from the calculated values of $NU_{odd}(x)$ and W(x). In order to generate a correction symbol, or correction vector YI, which is a non-zero coefficient of p(x) for a given code word symbol, the error value computation circuit 20 of FIG. 1 evaluates the 32 symbol values of NU(x) plus the lowest order coefficient of NU(x) which is always 1, and the 32 symbol values of W(x) for each code word symbol within the sector in real time at the same time as the corresponding symbol is shifted out of buffer 22 of FIG. 1. The results of these evaluations are then manipulated to generate the actual correction polynomial p(x).

To determine error locations, the usual practice is to use a Chien search, where all possible legitimate values of x are tested to find the roots of NU(x). Based on those roots, the erroneous symbols are identified, W(x) evaluated, and y(x) later corrected. However, the standard technique requires more latency than the present invention. To provide the advantage of low latency, the Chien search is modified to permit simultaneous evaluation of W(x), data flow is pipelined, and erroneous symbols are identified and corrected in real time as they exit buffer 22 of FIG. 1 on their way to data processing bus 28. This requires a Chien search as modified by the present invention to compute the value of NU(x) and W(x) as each symbol exits buffer 22, whereupon a decision is made as to whether the symbol is incorrect. If incorrect, the non-zero coefficient in p(x), computed from NU(x) and W(x), amends the erroneous symbol in .XOR. circuit 24.

Figure 11:
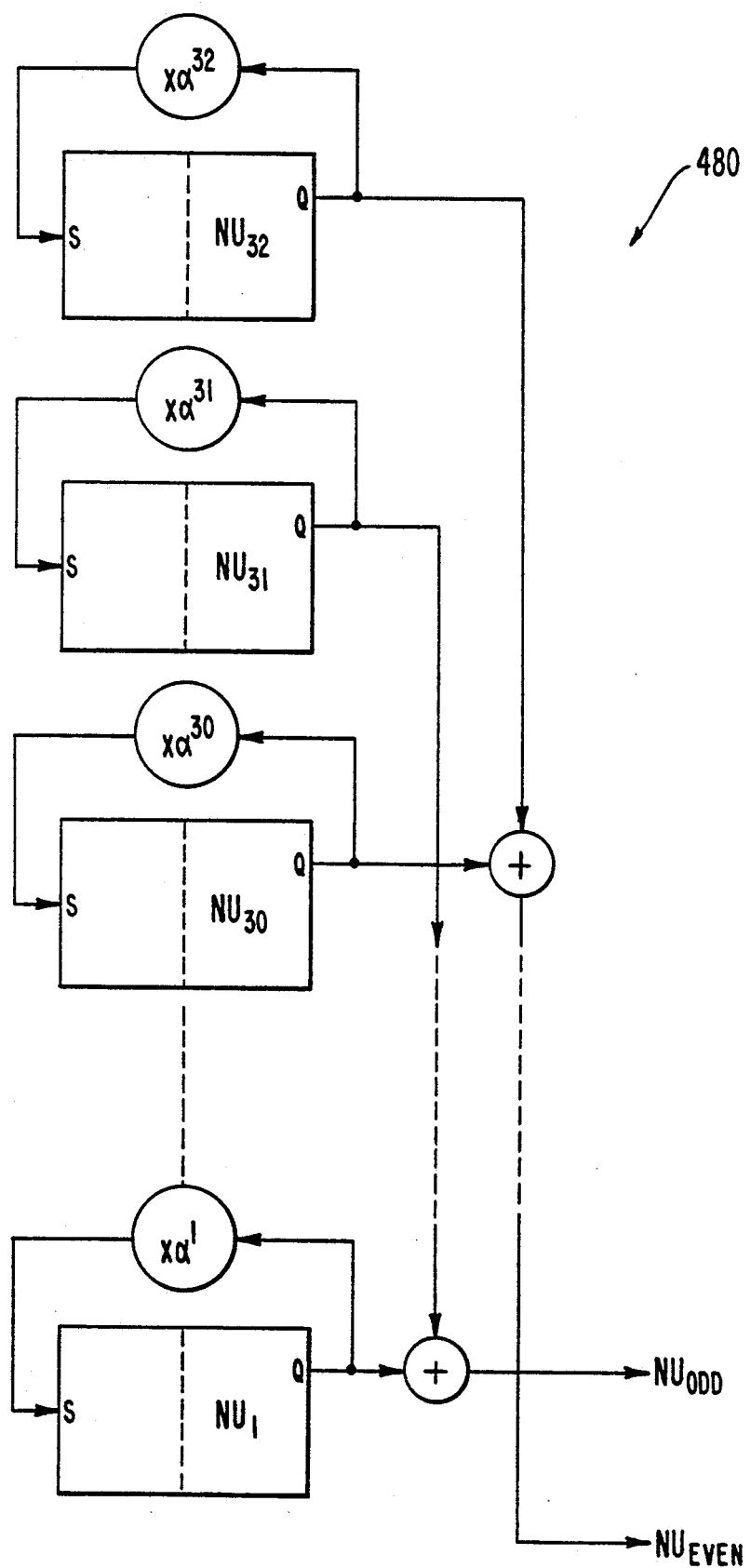
FIG. 11 is an electrical schematic diagram of the circuit that computes the value of the error locator polynomial NU(x) in real time for each symbol of the code word, namely steps 108, 110, and 112 of FIG. 3.

Circuit 480 of FIG. 11, consisting of a plurality of Galois Field multiplier means, each containing a 10 bit shift register and a Galois Field multiplier network, evaluates $NU(\alpha^i)$ as each code symbol is timed to exit buffer 22 of FIG. 1, where i is the number of the symbol exiting buffer 22 of FIG. 1. During each clock cycle, the contents of each NU register $NU_1$ to $NU_{32}$ is multiplied by the GF multiplier connected to the register, thereby testing for a root $\alpha^i$ of NU for each clock cycle. The contents of each NU register of circuit 480 is multiplied by its corresponding GF multiplier once for each corresponding data symbol. Values of NU for the even powers of x and values of NU for the odd powers of x are summed separately and are referred to as $NU_{even}$ and $NU_{odd}$. This completes steps 110 and 112 of FIG. 3. $NU_{odd}$ is required for subsequent error value calculations. At the same time as the NU(x) calculations, W(x) is also being evaluated by circuit 500 of FIG. 12 once for each symbol exiting buffer 22. In particular, circuit 500 of FIG. 12 computes $W(\alpha^i) \times \alpha^{34i}$ for each symbol, corresponding to step 116 of FIG. 3.

Figure 12:
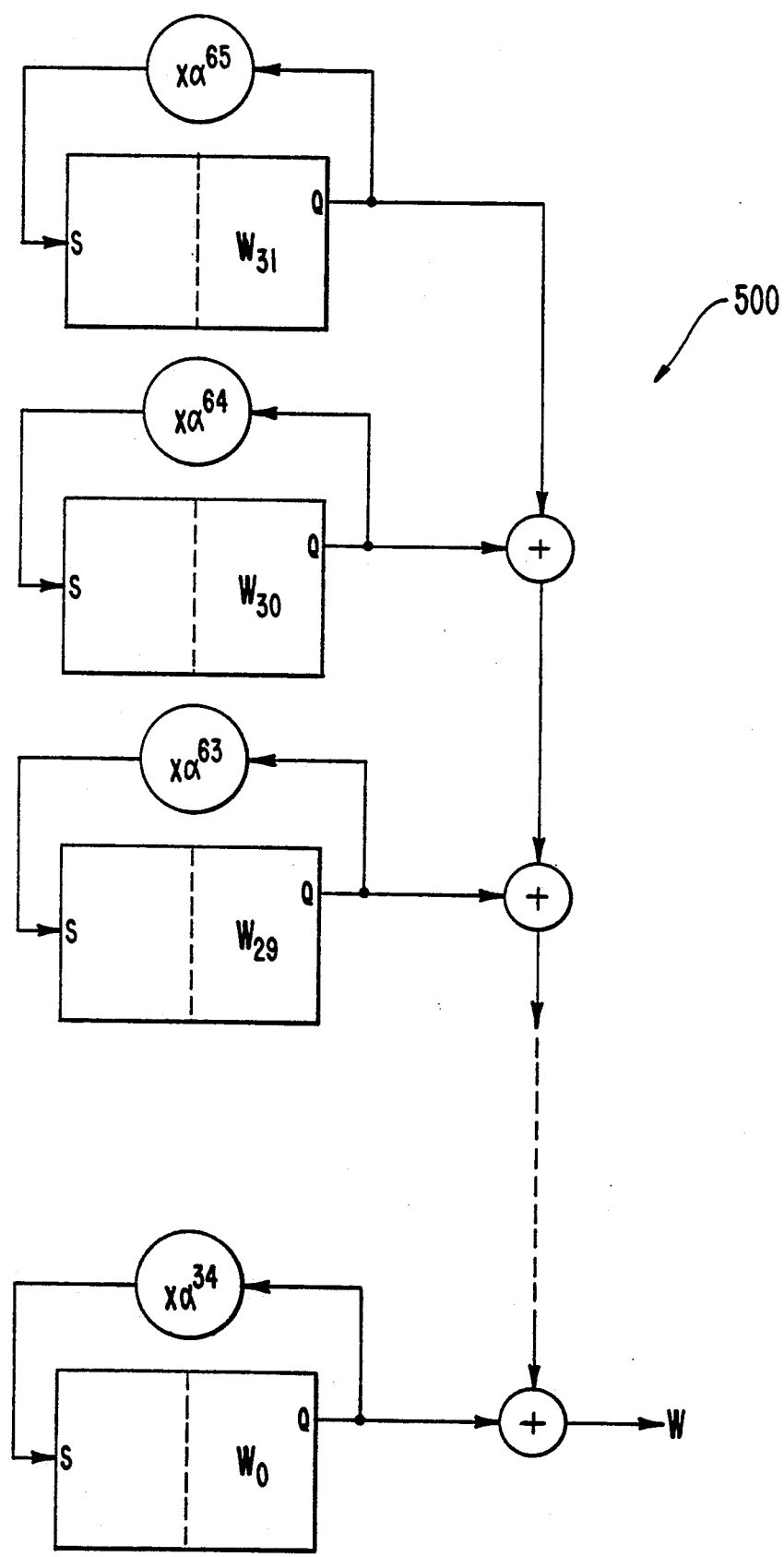
FIG. 12 is an electrical schematic diagram of the circuit that computes the value of the error evaluator polynomial W(x) in real time for each symbol of the code word, namely step 114 of FIG. 3.

Looking to FIG. 13, circuit 480 is the same circuit as shown in FIG. 11, and circuit 500 is the same circuit as shown in FIG. 12. Summer 520 computes NU(x) as the sum of $NU_{odd}$ and $NU_{even}$. If $NU(x)=1$ then the $i^{th}$ symbol of the code word exiting buffer 22 is in error, and gate 522 enables one input of gates 528 and 530, corresponding to step 120 of FIG. 3. At the same time, and regardless of whether the $i^{th}$ symbol is correct or not, divider circuit 524 computes the correct value, or correction vector of the $i^{th}$ code word symbol. This is shown as YI in step 116 of FIG. 3 and will be discussed in more detail hereinbelow. Also at the same time, logic gate 526 checks for $NU_{odd}=0$. If it is zero and $NU_{even}=1$, then gate 528 sets a system flag indicating to data processing system 28 of FIG. 1 that the decoded output of circuit 10 is erroneous. The disposition of the erroneous data is left up to the data processing system. Also, if $NU_{odd}=0$, correction vector YI will not be gated to .XOR. circuit 24 because gate 530 of FIG. 13 will be locked open. This corresponds to step 118 of FIG. 3. An error location found while $NU_{odd}=0$ indicates a malfunction of the decoding process.

Figure 14:
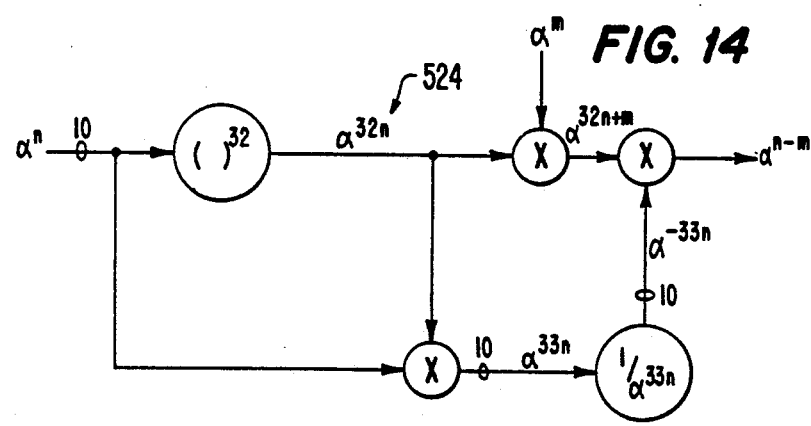
FIG. 14 is an electrical schematic diagram of the Galois Field divide calculator, which is circuit 524 of FIG. 13.

Divider circuit 524 of FIG. 13, shown in greater detail in FIG. 14, operates in a similar manner to the GF inverse circuit of FIG. 9 except that a second input and third multiplier have been added. Divider 524 calculates the correction vector YI, step 116 of FIG. 3, by dividing Z from step 114, which is represented by symbol $\alpha^m$ of FIG. 14, by $NU_{odd}$, which is represented by symbol $\alpha^n$ of FIG. 14. The resulting correction vector is therefore:

EQUATION 8

$$YI = \frac{W(\alpha^i)(\alpha^{34i})}{NU_{odd}(\alpha^i)}$$

This completes step 116 of FIG. 3.

Circuit 24 of FIG. 1 amends erroneous code word symbols by .XOR.ing the data stream from buffer 22 with the correction vectors, step 122 of FIG. 3. When a symbol is not in error, gate 530 of FIG. 13 is open and the correction vector is zero, therefore .XOR. circuit 24 leaves the data symbol unchanged. The buffer data stream must be synchronized with the computation of error values so that the correction vectors match the correct data symbols.

Buffer circuit 22 of FIG. 1 is a large first-in-first-out storage unit for data read from disk data port 26 and provides data to the data amend circuit 24 approximately 2 sector times following data entry to the buffer. In the preferred embodiment the input symbols are latched into a shift register once for each symbol read time, generating a 30 bit word. Each group of 3 symbols shifted in is written to a holding register, then later transferred into the buffer where the group remains until the end of the two sector delay time, whereupon the group of 3 symbols is received by a read shift register and sent to the data amend function 24 of FIG. 1, one symbol at a time.

The final function performed by the decoding circuitry is conversion of the amended 10 bit symbols into 16 bit data words and EDC words by converter 27 of FIG. 1. Bits 0-9 of the first data word are bits 0-9 of the first symbol. Bits 10-15 of the second data word are bits 0-5 of the second symbol. Conversion continues for all data words so that bits 0-7 of symbol 413 are bits 8-15 of the last data word, and bits 8 and 9 of the 413th symbol are discarded.

Figure 15:
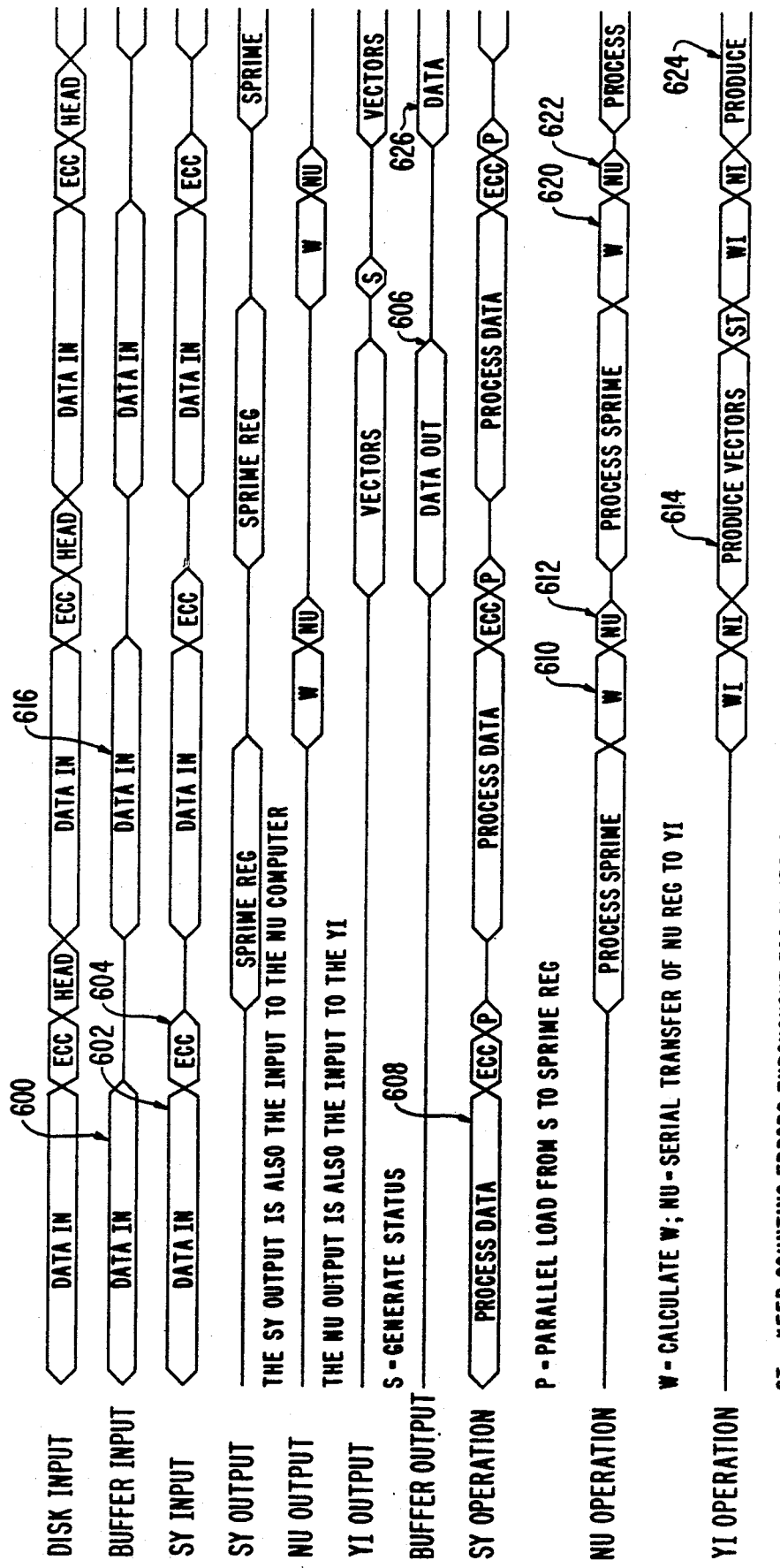
FIG. 15 is a timing diagram showing the time allocations for calculations and data transfers in the circuit of the present invention.

In describing the operation of circuit 10 of FIG. 1, reference is made to FIG. 15 which shows the time allocations for major data shifts and computations performed by the encoding and decoding circuits. The data flow between sections of circuit 10 is unidirectional, that is, there is no handshaking. Each section is ready to accept new data when the previous section is ready to supply it. The chip manipulates data in a synchronous manner, having one single clock source. The cycle time of the clock in the preferred embodiment is nominally 70 ns which is a half-symbol time. A full symbol time in the preferred embodiment is 140 ns.

Decoding commences with data symbols being read from the data storage device 26 into buffer 22 and syndrome computer 16 of FIG. 1, time slots 600 and 602 of FIG. 15, respectively. ECC symbols at time slot 604 are also read into syndrome computer 16. Buffer 22 holds data read during time slot 600 for approximately two sector times and does not release the data until time slot 606. As data in time slot 602 are being read into syndrome computer 16 of FIG. 1, the syndrome computer begins processing data during time slot 608. Following syndrome and amend syndrome computation, error evaluator polynomial W and error locator polynomial NU are computed during time slots 610 and 612 and are used to calculate correction vectors YI at time slot 614 as data symbols are being released from buffer 22 in time slot 606.

After the syndrome computation during time slot 608 is complete, syndrome computer 16 is now ready to begin computations on the next code word at time slot 616, with syndromes for these data being computed during time slot 618, and error evaluator and error locator polynomials being computed during time slots 620 and 622 respectively. Correction vectors during time slot 624 are calculated for the data of time slot 616 as they are released from buffer 22 during time slot 626.

This timing diagram clearly shows the pipelining made possible by the improved algorithms and circuits of the present invention.

In a second preferred embodiment, a savings is made in hardware in the exclusive OR (.XOR.) networks used to implement the GF $(\alpha^i)$ multiplications shown in FIG. 4 for the syndrome computer, FIG. 12 or FIG. 13 for the error evaluator polynomial W(x) computer, and FIG. 11 or FIG. 13 for the $NU_{odd}$ and $NU_{even}$ computers. To implement the $(\alpha^i)$ multipliers of the present invention, it is necessary to build an .XOR. network, such as the $\alpha^{-33}$ multiplier shown in FIG. 16. The $\oplus$ symbols are .XOR. gates. The input is a 10 bit symbol [SYMBOL A] and the output is a 10 bit symbol [SYMBOL A] $x\alpha^{-33}$.

Figure 16:
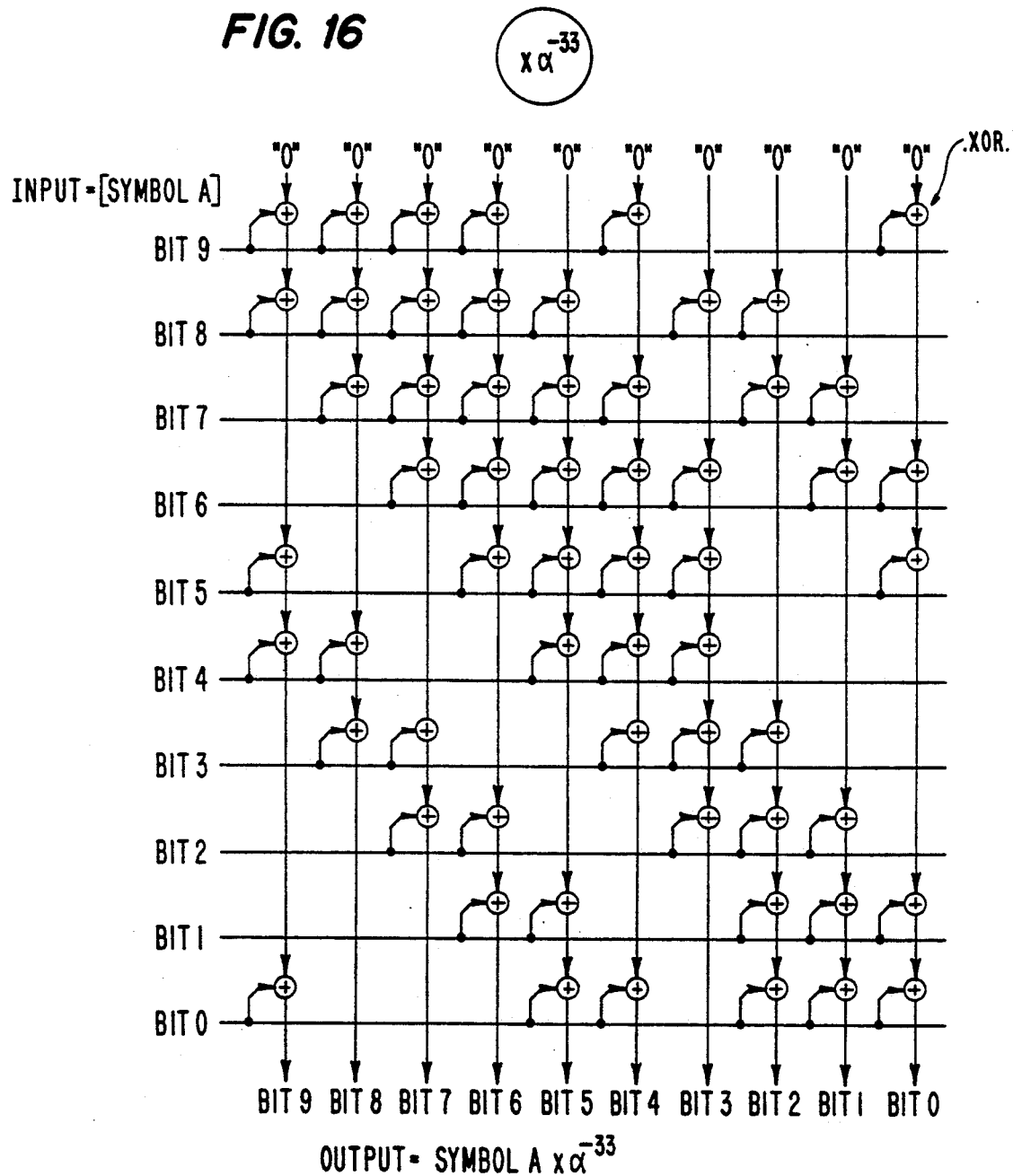
FIG. 16 is an electrical schematic diagram of an .XOR. network that functions as a GF $\alpha^{-33}$ multiplier.
Figure 17:
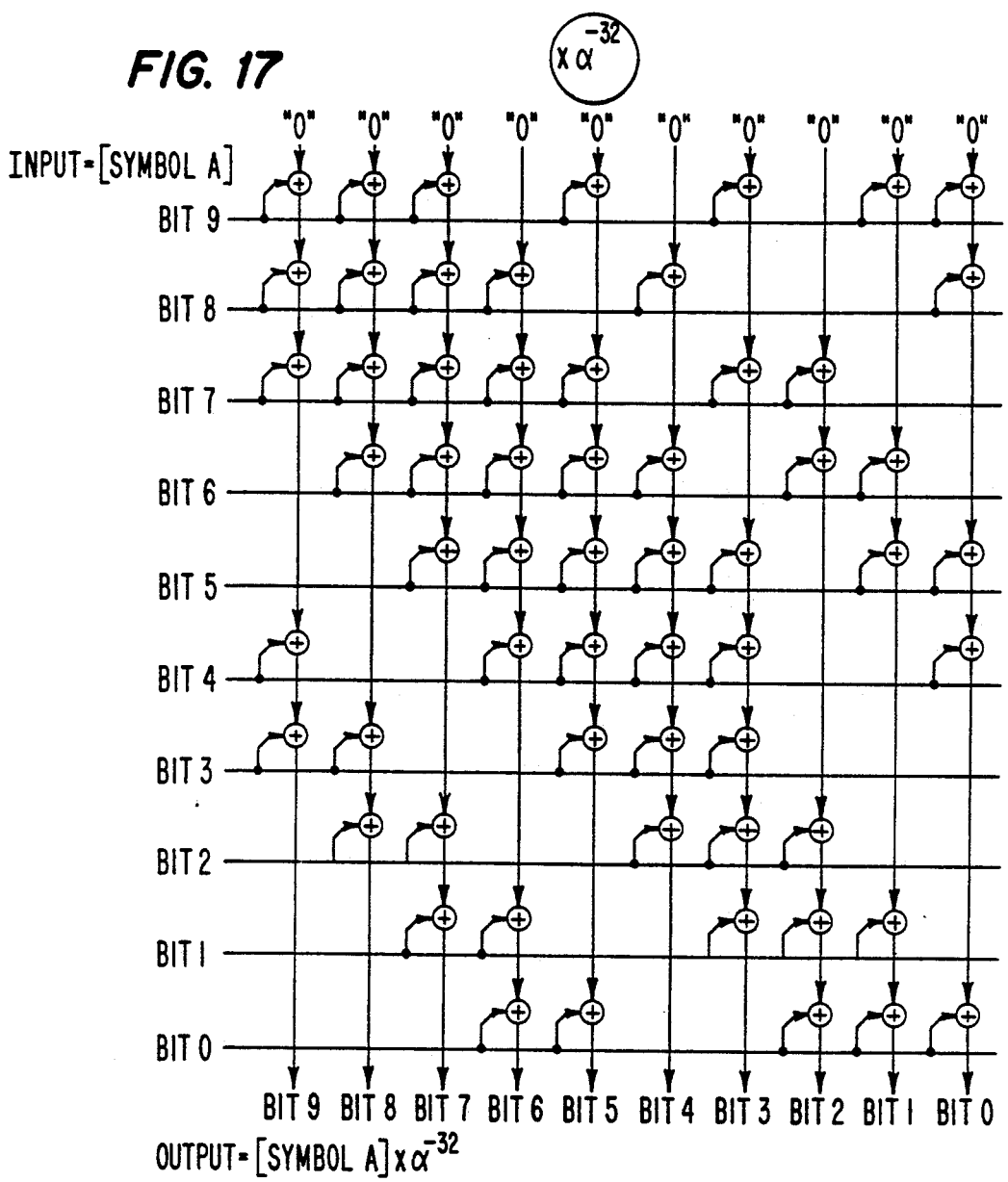
FIG. 17 is an electrical schematic diagram of an .XOR. network that functions as a GF $\alpha^{-32}$ multiplier.

The size of this kind of .XOR. network is large, requiring 59 .XOR. gates for the $\alpha^{-33}$ multiplier of FIG. 16, and 60 .XOR. gates for the $\alpha^{-32}$ multiplier of FIG. 17. These large .XOR. networks are complex to implement at the VLSI level, therefore it is difficult to build many of them in a small silicon integrated circuit. The second preferred embodiment of the present invention provides an improved Galois Field multiplier means which reduces the number and complexity of these GF multiplier circuits.

Figure 18:
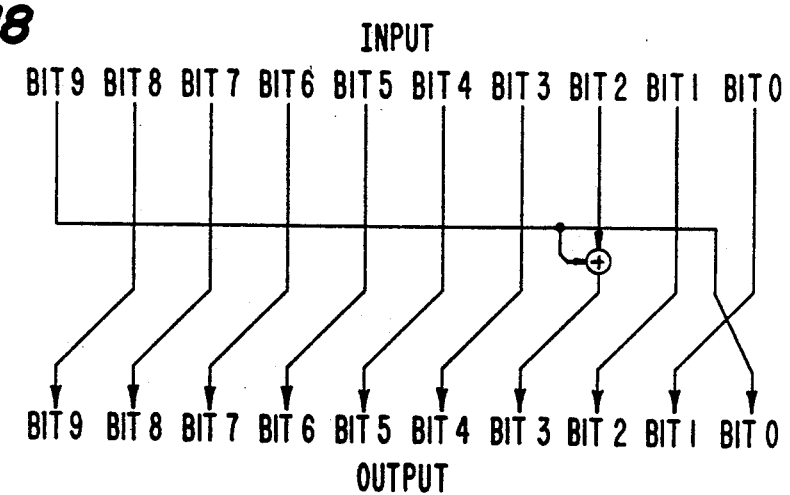
FIG. 18 is an electrical schematic diagram of an .XOR. network known as a Shift-1 circuit that performs the function of a GF $\alpha^1$ multiplier.
Figure 19:
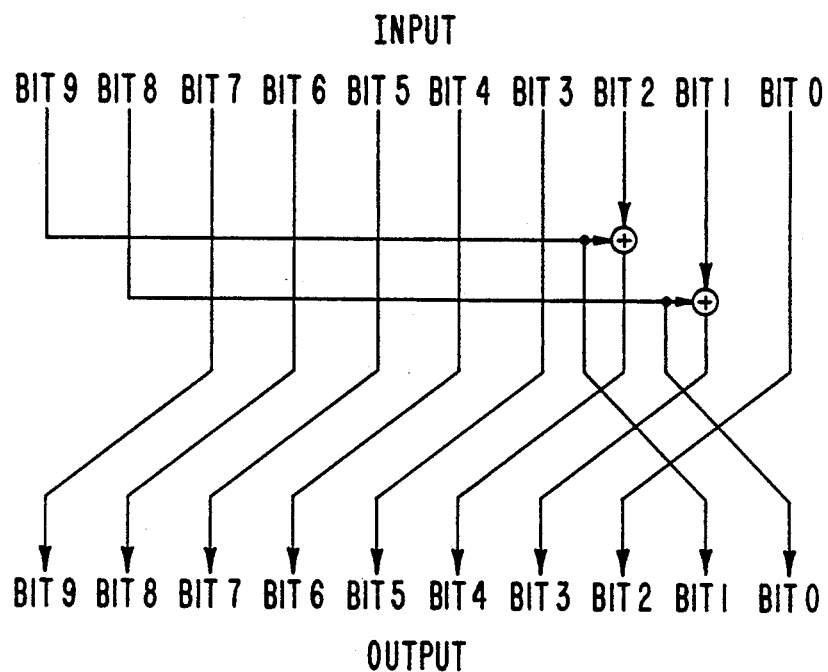
FIG. 19 is an electrical schematic diagram of an .XOR. network known as a Shift-2 circuit that performs the function of a GF $\alpha^2$ multiplier.
Figure 20A:
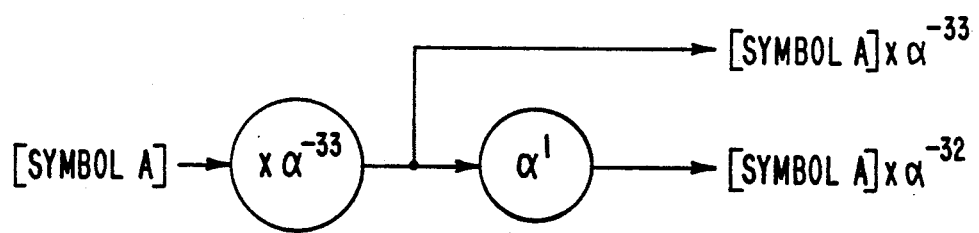
FIG. 20A is an electrical schematic diagram of a circuit to compute [SYMBOL A] x $\alpha^{-33}$ and [SYMBOL A] x $\alpha^{-32}$ using the $\alpha^{-33}$ multiplier of FIG. 16 and the $\alpha^1$ multiplier of FIG. 18.
Figure 20B:
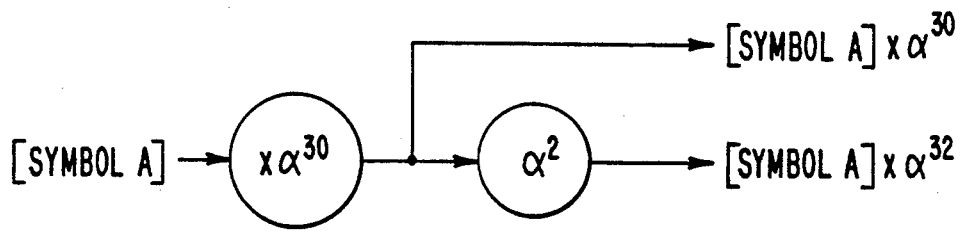
FIG. 20B is an electrical schematic diagram of a circuit to compute [SYMBOL B] x $\alpha^{30}$ and [SYMBOL B]×$\alpha^{32}$ using an $\alpha^{30}$ multiplier and the Shift-2 circuit of FIG. 19.

On the Galois Field, $\alpha^i (\text{x } \alpha^j) = \alpha^{i+j}$. For example, $\alpha^{-32}$ may be generated by multiplying $\alpha^{-33}$ by $\alpha^1$. A given $\alpha$ multiplier may therefore be constructed from products of simpler multipliers. The circuit of FIG. 18 shows an $\alpha^1$ multiplier circuit, or Shift-1 circuit, which uses one .XOR. gate to perform a modulo-2 addition (bit 9 .XOR. bit 2) to generate the output bit 3 and also uses some cross-connected input and output lines to transpose bits to provide the desired output. The circuit of FIG. 19 shows an $\alpha^2$ multiplier circuit, or Shift-2 circuit, consisting of two .XOR. gates and cross-connected inputs and outputs to produce the desired output. The circuits of FIG. 20a and 20b show how the product of a complex $\alpha$ multiplier, $\alpha^{-33}$ or $\alpha^{30}$, and a simple multiplier, $\alpha^1$ or $\alpha^2$, can produce an output that ordinarily would require two complex multipliers, thereby considerably reducing circuit complexity. In FIG. 20a, an $\alpha^{-33}$ and an $\alpha^1$ multiplier produce an output consisting of the input symbol [SYMBOL A] times $\alpha^{-33}$ and also times $\alpha^{-32}$ for a net savings of 59 .XOR. gates, or one $\alpha^{-32}$ multiplier network. Similarly, as shown in FIG. 20b, the values of [SYMBOL B] x$\alpha^{30}$ and [SYMBOL B] x$\alpha^{32}$ are generated using and $\alpha^{30}$ multiplier and a Shift-2 circuit, thereby eliminating an $\alpha^{32}$ multiplier.

Figure 21:
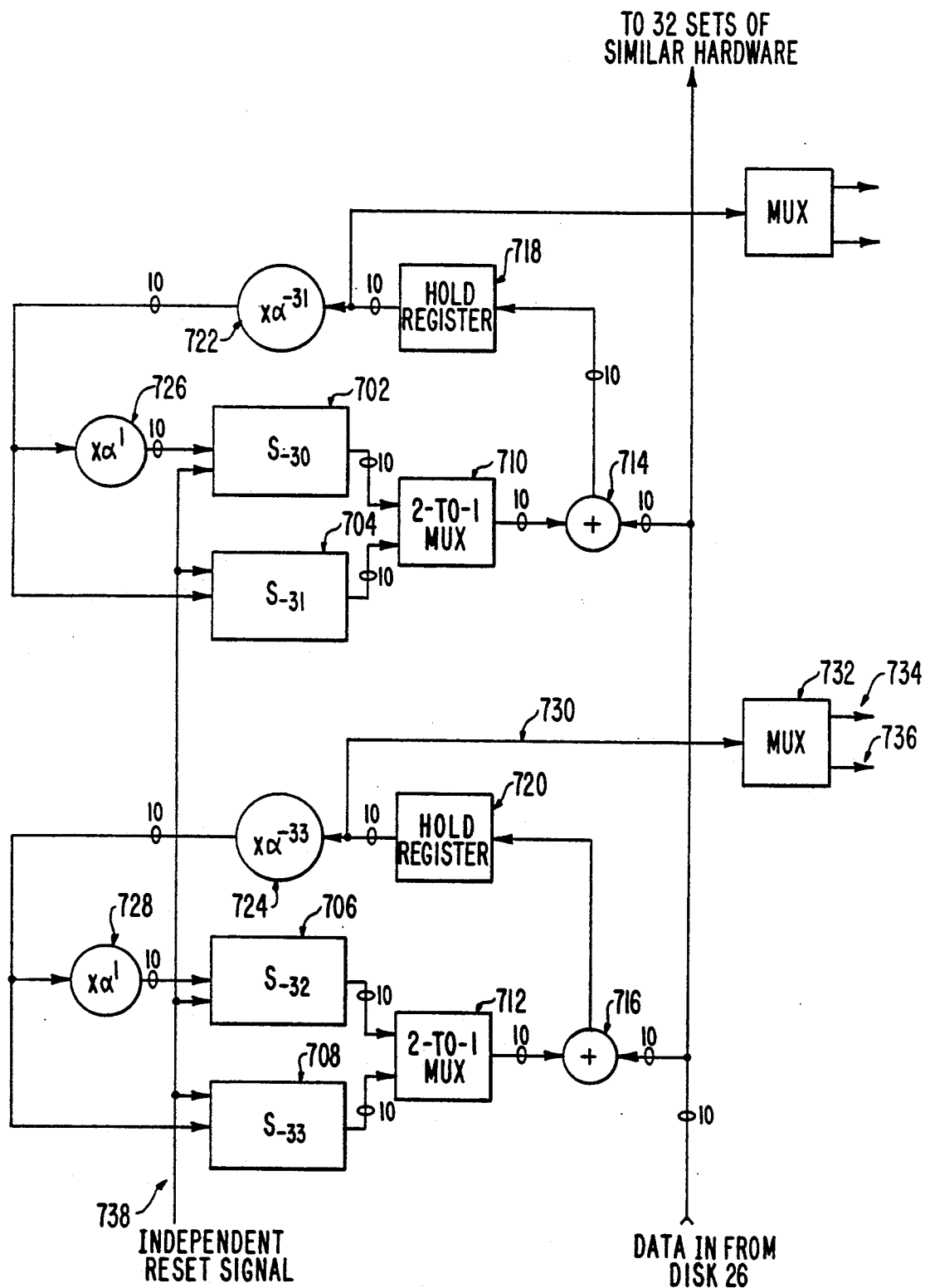
FIG. 21 is an electrical schematic diagram of a preferred embodiment of the Syndrome Compute circuit of FIG. 4 using the Shift-1 circuit of FIG. 18 to eliminate approximately half of the multiplier circuitry.

The application of this technique to the GF multiplier means of the present invention eliminates almost half of the complex .XOR. networks required by the syndrome computer and error locator and error evaluator computers. FIG. 21 shows the syndrome computer of FIG. 4 configured to according to the second preferred embodiment to exploit the technique of reducing the complexity of the GF multipliers. To simplify the drawings, only the S(−30) to S(−33) registers and related GF multipliers and multiplexers (MUXes) are shown and described; the rest being repetitive. The function of the syndrome computers has already been described hereinabove. Only the application of the GF multiplier means hardware reduction techniques to the syndrome computer will now be discussed.

Syndrome computer 16 of FIG. 1 processes one symbol through the syndrome compute circuit of FIG. 4 or FIG. 21 approximately every 140 ns (a full symbol clock) in both preferred embodiments. In the second preferred embodiment of the syndrome computer circuit as shown in FIG. 21, the syndrome compute circuit consists of a plurality of Galois Field multiplier means each comprising two 10-bit registers coupled to a modulo-2 adder by a 2-to-1 multiplexer, a hold register, a complex GF multiplier .XOR. network, and a simple Shift-1 multiplier.

Before syndrome computer 16 begins doing calculations, all S registers, 702, 704, 706, and 708 of FIG. 21, are cleared by a signal on reset line 738. During the first half symbol clock or approximately 70 ns, the 2-to-1 multiplexers (2-to-1 MUXes) 710 and 712 are enabled to allow the contents in the odd numbered S registers, S(−33), S(−31), etc. to modulo-2 add their contents by GF addition in adders 714 and 716 to the 10 bit data symbols from disk 26 of FIG. 1. The resulting sums are stored in hold registers 718 and 720. The contents of the hold registers are next multiplied by the GF multipliers, $\alpha^{-31}$ and $\alpha^{-33}$, 722 and 724, and the resulting product is loaded into S(−31) and S(−33) registers 704 and 708. The contents of S(−31) register 704 are [(previous S(−31) register contents)+(data symbol from disk 26)]×$\alpha^{-31}$, and the contents of S(−33) register 708 are: [(previous S(−33) register contents)+(data symbol from disk 26)] x $\alpha^{-33}$.

In the next half symbol clock of approximately 70 ns, the 2-to-1 MUXes 710 and 714 are enabled to select the contents in the even numbered S registers 702 and 706, only two of which are shown in FIG. 21, and add the contents of the even numbered S registers to the same ten-bit symbol present on the data-in bus from disk 26 in adders 714 and 716. The result is stored in hold registers 718 and 720. The contents in the hold registers 718 and 720 are again multiplied by the GF multipliers, $\alpha^{-31}$ and $\alpha^{-33}$, 722 and 724 respectively of FIG. 21, the output values are next multiplied by the Shift-1 circuits 726 and 728, and the results are stored in registers 702 and 706. The contents of S(−30) register 702 are [(previous S(−30) register contents)+(data symbol from disk 26)] x $\alpha^{-30}$ and the contents of S(−32) register 706 are [(previous S(−32) register contents)+(data symbol from disk)] x $\alpha^{-32}$. This add and multiply calculation is repeated for the next ten-bit data symbol retrieved from the disk.

In the first preferred embodiment of the syndrome computer, an output value of S is provided from the output of each adder associated with each S register as shown in FIG. 4. In the second preferred embodiment, one output line, for example 730 of FIG. 21, provides the output for two S registers, 706, 708. One value of S is output every half symbol clock to multiplexer 732 which directs the symbol to its respective S' register of FIG. 5 via lines 734 and 736.

Figure 22A:
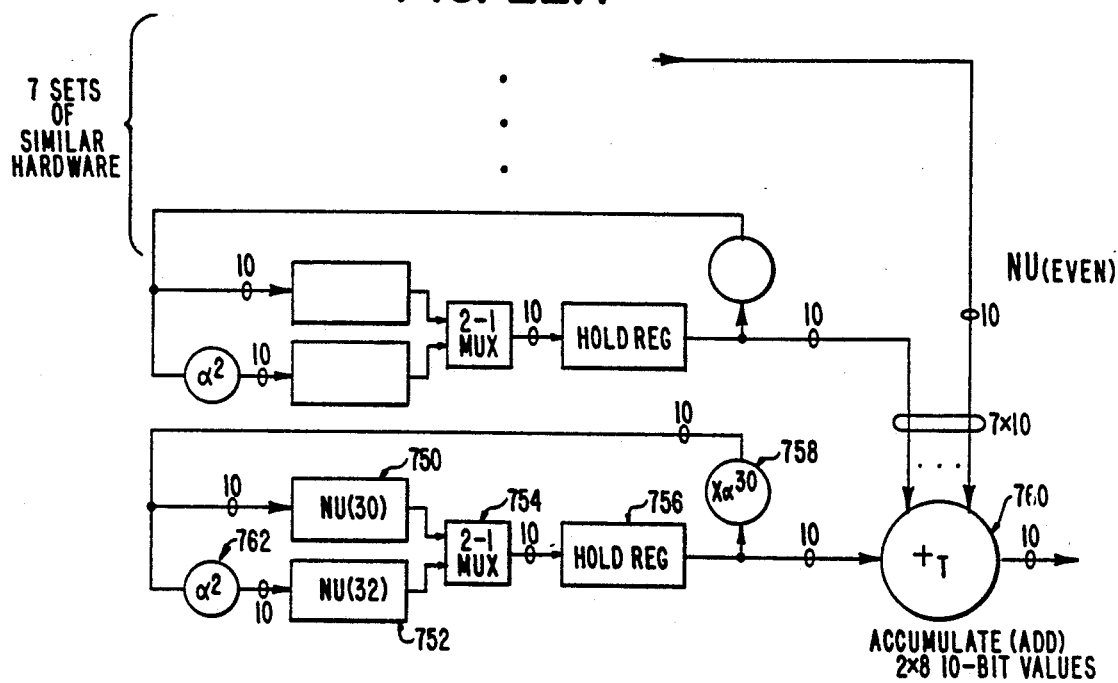
FIG. 22A is a second preferred embodiment of the $NU_{even}$ circuit of FIG. 13 using the Shift-2 circuit of FIG. 19.
Figure 22B:
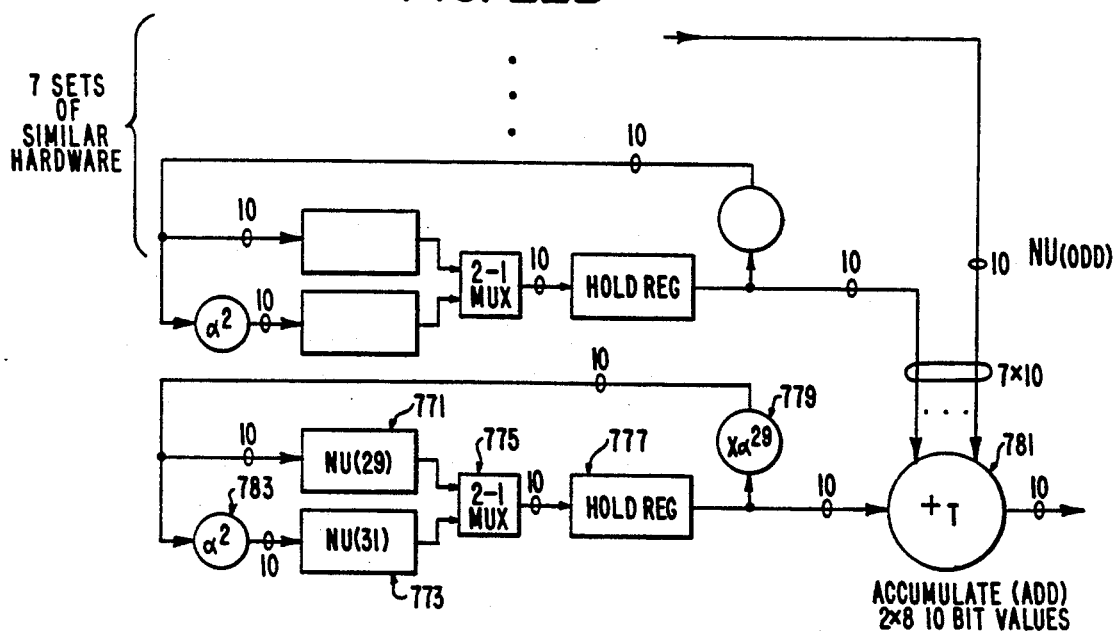
FIG. 22B is an electrical schematic diagram of a second preferred embodiment of the $NU_{odd}$ circuit of FIG. 13 using the Shift-2 circuit of FIG. 19.

FIGS. 22a and 22b show the error locator polynomial NU(x) computer circuit 480 of FIG. 11 or FIG. 13 for computing NU$_{odd}$ and NU$_{even}$ configured to according to the second preferred embodiment to exploit the technique of reducing the complexity of the GF multipliers. FIGS. 22a and 22b show only small portions of the computers to illustrate the implementation of the technique. The circuits of FIGS. 22a and 22b perform the same functions as the equivalent circuits 480 of FIG. 11 or FIG. 13 in the first preferred embodiment, therefore the function of these circuits will not be discussed further. Only the application of the GF multiplier hardware reduction techniques to the error locator computer will now be discussed.

In the second preferred embodiment as shown in FIGS. 22a and 22b, the NU$_{even}$ and NU$_{odd}$ computer consists of a plurality of Galois Field multiplier means, each comprising two 10-bit shift registers coupled to a hold register by a 2-to-1 multiplexer, a complex GF multiplier .XOR. network, and a simple Shift-2 multiplier for repetitively multiplying the contents of the shift registers by a value of $\alpha^i$. Before the NU calculators start doing calculations, a set of ten-bit symbol values are loaded into all NU even numbered registers 750, 752 (only a representative two of which are labeled) and all NU odd numbered registers 771, 773 (only a representative two of which are labeled) from bus 456 (connection not shown). During the first half symbol clock of approximately 70 ns the 2-to-1 MUXes 754, 775 are enabled to copy the contents of the NU(30) and NU(29) registers, 750, 771 respectively, into the hold registers 756, 777. The contents of hold registers 756, 777 are then multiplied by $\alpha^{30}$ and $\alpha^{29}$ GF multipliers 758, 779. The outputs of GF multipliers 758, 779 are loaded back into the corresponding NU(30) and NU(29) registers, 750, 771. The contents of NU(30) register 750 is now equal to [previous NU(30) register contents] $x\alpha^{30}$ and the contents of NU(29) register 771 is [previous NU(29) register contents] $x\alpha^{29}$.

During the next half symbol clock the 2-to-1 MUXes 754, 775 are enabled to copy the contents in the NU(32) and NU(31) registers 752, 773 into their respective hold registers 756, 777. The contents of the hold registers are next multiplied by the same GF $\alpha^{30}$ and $\alpha^{29}$ multipliers, 758, 779. The output values of the GF multipliers 758, 779 are loaded back into the corresponding NU(32) and NU(31) registers 752, 773 after being multiplied by $\alpha^2$ in the respective Shift-2 circuits 762, 783. Now the contents of NU(32) register 752 is equal to [previous NU(32) register contents] $x\alpha^{32}$ and the contents of NU(31) register 773 is equal to [previous NU(31) register contents] $x\alpha^{31}$. This process is again repeated in the next symbol clock.

Figure 23:
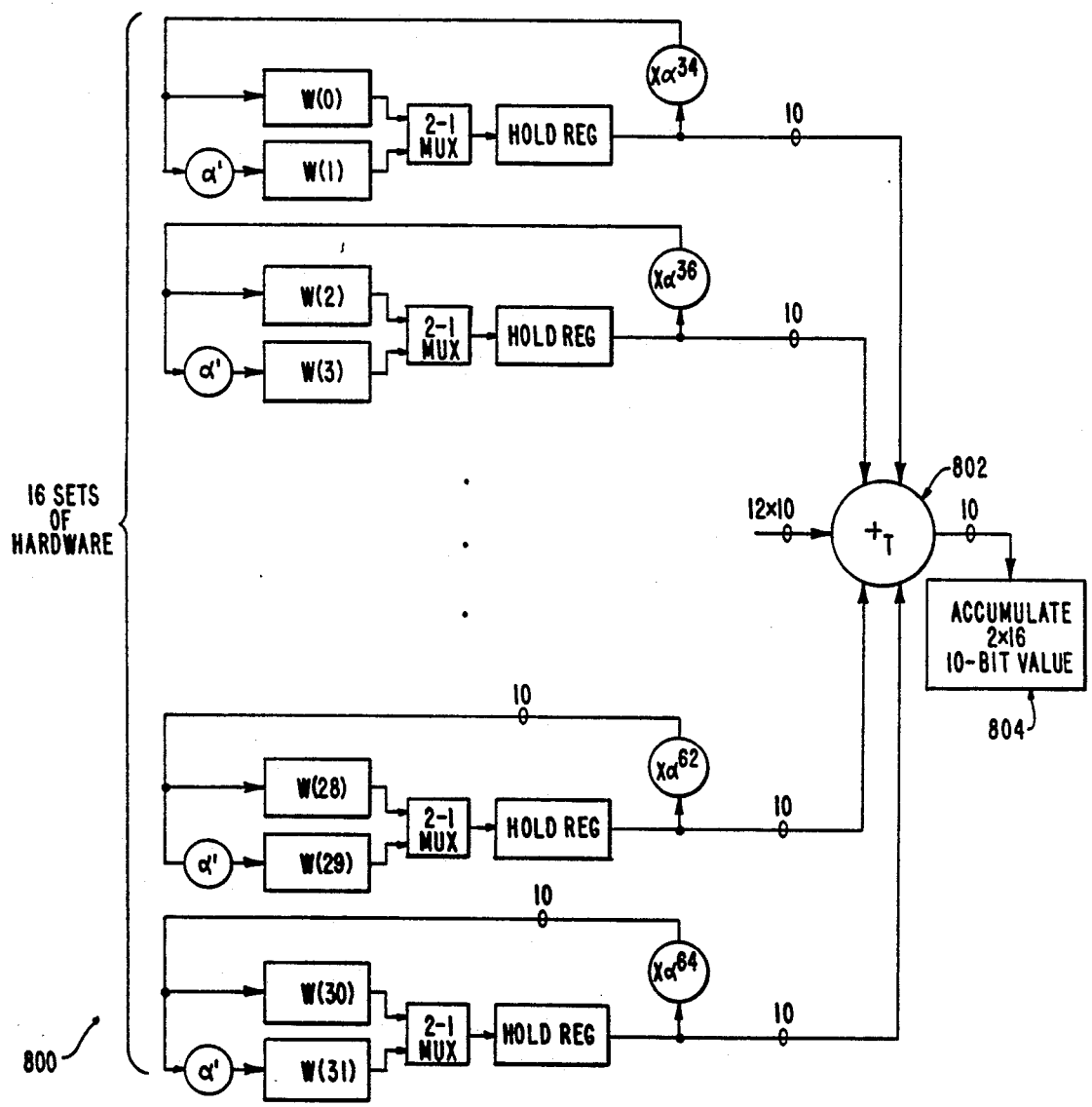
FIG. 23 is an electrical schematic diagram of a second preferred embodiment of the error evaluator polynomial W(x) computer of FIG. 12 using the Shift-1 circuit of FIG. 18.

FIG. 23 shows the error evaluator polynomial W(x) computer circuit 500 of FIG. 12 or FIG. 13, configured to according to the second preferred embodiment to exploit the technique of reducing the complexity of the GF multipliers. FIG. 23 shows only a small portion of the computer to illustrate the implementation of the technique. The circuit of FIG. 23 performs the same functions as the equivalent circuit 500 of FIG. 12 or FIG. 13 in the first preferred embodiment, therefore the function of this circuit will not be discussed further. Only the application of the GF multiplier hardware reduction techniques to the error evaluator computer will now be discussed.

Error evaluator circuit 800 consists of a plurality of Galois Field multiplier means, of the same form as the $NU_{odd}$ and $NU_{even}$ circuits of FIGS. 22a and 22b, for repetitively multiplying the contents of the NU registers by $\alpha^i$, and functions in a similar manner. Even values of W() are calculated and stored in the even W registers during one half symbol clock and odd values are calculated and stored in the odd W registers during the next half symbol clock. Only even numbered $\alpha$ multipliers are provided; the odd $\alpha$ multipliers are provided by the simple Shift-1 circuit.

Because only half of the W values are calculated and summed in treed adder 802 during each half symbol clock, accumulator 804 stores and adds the even and odd outputs of adder 802 to provide the full value of W() for computation of the correction vector as shown on FIG. 13.

By applying the technique of the second preferred embodiment to the syndrome computer, only 34 complex GF multiplier .XOR. networks are required rather than the 67 required to implement the algorithm in hardware in the first preferred embodiment. Likewise, this technique reduces the need for .XOR. networks in the $NU_{even}$, $NU_{odd}$, and W computers from 64 to 32.

Additional advantages and modifications will readily occur to those skilled in the art. The invention in its broader aspects is, therefore, not limited to the specific details, representative apparatus and illustrative examples shown and described. Accordingly, departures may be made from such details without departing from the spirit or scope of applicants' general inventive concept.

What is claimed is:

1. A circuit for detecting and correcting errors in binary data symbols which have been encoded using a Reed-Solomon error correction code to produce Reed-Solomon code words, wherein each code word includes in it a selected number of data symbols, said circuit comprising:
   A. buffer means for receiving at least one code word having the selected number of data symbols and releasing each of the received data symbols after a preselected time period;
   B. decoder means for computing for each received code word error locations and error values by (i) determining an error locator equation and finding roots of said error locator equation, the roots corresponding to error locations, and (ii) determining associated error values, the decoder means including a plurality of Galois Field (GF) multiplier means for repetitively GF multiplying signals associated with said received code words by $\alpha^i$, each of said GF multiplier means comprising:
      1. a multiplexer for passing a first input signal during a first predetermined time interval and a second input signal during a second predetermined time interval to obtain a first output signal;
      2. a first Galois Field (GF) multiplier for multiplying the first output signal by a first predetermined value to produce a second output signal;
      3. a first register coupled to provide the first input signal to the multiplexer and to store the resulting second output signal during the first predetermined time interval;
      4. a second GF multiplier for multiplying the second output signal by a second predetermined value to produce a third output signal; and
      5. a second register coupled to provide the second input signal to the multiplexer and store the resulting third output signal during the second predetermined time interval;
   wherein said decoder means combines at predetermined times the contents of selected one of said first and second registers and uses the combinations in determining the error locations and associated error values; and
   C. correcting means, responsive to the computed error locations and error values, for correcting each of the received data symbols having an error upon release of the symbol from the buffer means.

2. The circuit of claim 1 wherein the decoder means simultaneously determines the error locations and the associated error values.

3. The circuit of claim 2 wherein said decoder means further includes:
  A. means for simultaneously evaluating $NU_{odd}(\alpha^i)$, $NU_{even}(\alpha^i)$ and $W(\alpha^i)$ corresponding to each received data symbol as that symbol is released from said buffer, where $\alpha^i$ corresponds to a code word location, and $NU_{even}(\alpha^i)$ and $NU_{odd}(\alpha^i)$ are the sums of the even and odd terms, respectively, of the error locator polynomial calculated at $\alpha^i$; and
  B. means for simultaneously evaluating an expression $NU_{odd}(\alpha^i)+NU_{even}(\alpha^i)$ and calculating a correction vector YI corresponding to each of said received data symbols, where:

$$YI = \frac{W(\alpha^i) * \alpha^{34i}}{NU_{odd}(\alpha^i)}$$

the correcting means correcting errors by combining with YI each of said received data symbols associated with an $\alpha^i$ for which the expression $NU_{odd}(\alpha^i)+NU_{even}(\alpha^i)$ equals a predetermined value.

4. The circuit of claim 3 wherein the means for computing the values of an error evaluator polynomial $W(x)$ includes Galois Field (GF) multiplier means for repetitively multiplying a signal by $\alpha^i$, the multiplier means comprising:
  A. a multiplexer for passing a first input signal during a first predetermined time interval and a second input signal during a second predetermined time interval to obtain a first output signal;
  B. a first Galois Field (GF) multiplier for multiplying the first output signal by a first predetermined value to produce a second output signal;
  C. a first register coupled to provide the first input signal to the multiplexer and to store the resulting second output signal during the first predetermined time interval;
  D. a second GF multiplier for multiplying the second output signal by a second predetermined value to produce a third output signal; and
  E. a second register coupled to provide the second input signal to the multiplexer and store the resulting third output signal during the second predetermined time interval;
  wherein the first and second registers contain, after a predetermined number of repetitions, signals associated with the coefficients of the error locator polynomial, $W(x)$.

5. The circuit of claim 1 wherein said decoder means further includes computing means for computing syndromes $S_i$ for each of said received code words as the code word data symbols are received, the computing means comprising:
  i. a plurality of S computers for generating the coefficients $S_i$ of a syndrome polynomial $S(x)$; and
  ii. an amend syndrome calculator for amending the coefficients of $S(x)$ to correspond to a shortened code.

6. The circuit of claim 5 wherein each S computer includes a Galois Field (GF) multiplier means for repetitively GF multiplying input signals associated with the syndromes by $\alpha^i$, the multiplier means comprising:

a. a logical AND circuit responsive to a feedback signal and an input signal for providing a first output signal;
  b. a GF multiplier responsive to the first output signal for GF multiplying the first output signal by a predetermined value at a predetermined time to obtain a second output signal;
  c. a storage register for storing the second output signal; and
  d. a GF adder for adding the stored second output signal to a data signal and providing the sum as the input signal to the logical AND circuit.

7. The circuit of claim 5 wherein the decoder means includes means for simultaneously computing from the amended coefficients the values of an error locator polynomial $NU(x)$ associated with the error locator equation and an error evaluator polynomial $W(x)$ for each of the received data symbols where:

$$NU(x)S(x) = W(x) \text{ modulo } x^t$$

and t is the number of errors which the Reed-Solomon Code is capable of correcting.

8. The circuit of claim 7 wherein each S computer includes a Galois Field (GF) multiplier means for repetitively multiplying a signal by $\alpha^i$, the GF multiplier means comprising:
  A. a multiplexer for passing a first input signal during a first predetermined time interval and a second input signal during a second predetermined time interval to obtain a first output signal;
  B. modulo-2 adder means for adding the first output signal to a data signal to obtain a second output signal;
  C. a first Galois Field (GF) multiplier for multiplying the second output signal by a first predetermined value to produce a third output signal;
  D. a first register coupled to provide the first input signal to the multiplexer and to store the third output signal during the first predetermined time interval;
  E. a second GF multiplier for multiplying the third output signal by a second predetermined value to produce a fourth output signal; and
  F. a second register coupled to provide the second input signal to the multiplexer and to store the fourth output signal during the second predetermined time interval;
  wherein, after a predetermined number of repetitions, the contents of said first and second registers correspond to the coefficients $S_i$ of the syndrome polynomial $S(x)$.

9. The circuit of claim 7 wherein the means for computing the values of the error locator polynomial $NU(x)$ includes Galois Field (GF) multiplier means for repetitively multiplying signals associated with coefficients of $NU(x)$ by $\alpha^i$, the multiplier means comprising:
  A. storage means having an input port and an output port, the input port receiving an input signal for storage and the output port supplying the stored signal as an output signal; and
  B. a GF multiplier to recursively generate the input signal by GF multiplying the output signal by a predetermined value.

10. The circuit of claim 7 wherein the means for computing the values of an error evaluator polynomial W(x) includes a plurality of Galois Field (GF) multiplier means for repetitively multiplying signals associated with coefficients of W(x) by $\alpha^i$, each of said GF multiplier means comprising:
  A. storage means having an input port and an output port, the input port receiving an input signal for storage and the output port supplying the stored signal as an output signal; and
  B. a GF multiplier to recursively generate the input signal by GF multiplying the output signal at a predetermined time.

11. A circuit for detecting and correcting errors in binary data symbols which have been encoded using a Reed-Solomon error correction code to produce Reed-Solomon code words, wherein each code word includes in it a selected number of data symbols, said circuit comprising:
  A. buffer means for receiving at least one code word having the selected number of received data symbols and releasing each of the received data symbols after a preselected time period;
  B. decoder means for computing for each received code word error locations and error values by (i) determining an error locator equation and finding roots of said error locator equation, the roots corresponding to error locations, and (ii) determining associated error values, the decoder means including a plurality of Galois Field (GF) multiplier means for repetitively GF multiplying signals associated with said received code words by $\alpha^i$, each of said GF multiplier means comprising:
    1. a multiplexer for passing a first input signal during a first predetermined time interval and a second input signal during a second predetermined time interval to obtain a first output signal;
    2. a first Galois Field (GF) multiplier for multiplying the first output signal by a first predetermined value to produce a second output signal;
    3. a first register coupled to provide the first input signal to the multiplexer and to store the resulting second output signal during the first predetermined time interval;
    4. a second GF multiplier for multiplying the second output signal by a second predetermined value to produce a third output signal; and
    5. a second register coupled to provide the second input signal to the multiplexer and store the resulting third output signal during the second predetermined time interval;
    wherein the first and second registers contain, after a predetermined number of repetitions, signals associated with coefficients $S_i$ of a syndrome polynomial S(x) and said decoder means manipulates the coefficients to produce an error locator equation NU(x) and an error evaluator polynomial W(x) and uses the equation and polynomial in determining the error locations and associated error values; and
  C. correcting means, responsive to the computed error locations and error values, for correcting each of the received data symbols having an error upon release of the symbol from the buffer means.

12. The circuit for detecting and correcting errors in binary data symbols of claim 11, wherein said GF multiplying means further includes a GF adder for adding a data signal to the output of the multiplexer to produce the first output signal.

13. A circuit for detecting and correcting errors in binary data symbols which have been encoded using a Reed-Solomon error correction code to produce Reed-Solomon code words, wherein each code word includes in it a selected number of data symbols, said circuit comprising:
  A. buffer means for receiving at least one code word having the selected number of received data symbols and releasing each of the received data symbols after a preselected time period;
  B. decoder means for computing for each received code word error locations and error values by (i) determining an error locator equation and finding roots of said error locator equation, the roots corresponding to error locations, and (ii) determining associated error values, the decoder means including a plurality of Galois Field (GF) multiplier means for repetitively GF multiplying signals associated with said received code words by $\alpha^i$, each of said GF multiplier means comprising:
    1. a multiplexer for passing a first input signal during a first predetermined time interval and a second input signal during a second predetermined time interval to obtain a first output signal;
    2. a first Galois Field (GF) multiplier for multiplying the first output signal by a first predetermined value to produce a second output signal;
    3. a first register coupled to provide the first input signal to the multiplexer and to store the resulting second output signal during the first predetermined time interval;
    4. a second GF multiplier for multiplying the second output signal by a second predetermined value to produce a third output signal; and
    5. a second register coupled to provide the second input signal to the multiplexer and store the resulting third output signal during the second predetermined time interval;
    wherein the first and second registers contain, after a predetermined number of repetitions, signals associated with coefficients of an error evaluator polynomial W(x) and said decoder uses the coefficients in determining error values associated with error locations; and
  C. correcting means, responsive to the computed error locations and error values, for correcting each of the received data symbols having an error upon release of the symbol from the buffer means.

14. A method for detecting and correcting errors in binary data symbols which have been encoded using a Reed-Solomon error correction code to produce Reed-Solomon code words, wherein each code word includes in it a selected number of data symbols, said method comprising the steps of:
  A. receiving at least one code word having the selected number of data symbols and holding each of the received data symbols in a buffer for a preselected time period;
  B. computing for each received code word error locations and error values by (i) determining an error locator equation and finding roots of the error locator equation, the roots corresponding to error locations, and (ii) determining associated error values, wherein said computing step includes repetitively Galois Field (GF) multiplying by $\alpha^i$ signals associated with said received code words by—

1. passing a first input signal during a first predetermined time interval and a second input signal during a second predetermined time interval to obtain a first output signal;
2. GF multiplying the first output signal by a first predetermined value to produce a second output signal;
3. storing in a first register the second output signal during the first predetermined time interval;
4. GF multiplying the second output signal by a second predetermined value to produce a third output signal;
5. storing in a second register the third output signal during the second predetermined time interval;
6. coupling the stored second output signal to the multiplexer during the first predetermined time interval;
7. coupling the stored third output signal to the multiplexer during the second predetermined time interval; and manipulating at predetermined times the contents of selected ones of said first and second registers to determine error locations and error values corresponding to the received code words;

D. releasing each of the received data symbols from the buffer after the preselected time period; and
E. correcting, in response to the computed error locations and associated error values, each of the received data symbols having an error when the symbol is released from the buffer.

15. The method of claim 14, wherein said step of computing error locations and error values includes the steps of:
   a. simultaneously evaluating $NU_{odd}(\alpha^i)$, $NU_{even}(\alpha^i)$ and $W(\alpha^i)$ corresponding to each received data symbol as that symbol is released from said buffer, where $\alpha^i$ corresponds to a code word location, and $NU_{even}(\alpha^i)$ and $NU_{odd}(\alpha^i)$ are the sums of the even and odd terms, respectively, of the error locator polynomial calculated at $\alpha^i$; and
   b. simultaneously evaluating an expression $NU_{odd}(\alpha^i) + NU_{even}(\alpha^i)$ and calculating a correction vector YI corresponding to each of said received data symbols, where: $YI = W(\alpha^i) * \alpha^{34i} / NU_{odd}(\alpha^i)$ the errors being corrected by combining with YI each of said received data symbols associated with an $\alpha^i$ for which the expression $NU_{odd}(\alpha^i) + NU_{even}(\alpha^i)$ equals a predetermined value.

16. The method of claim 14 wherein the step of computing the value of an error evaluator polynomial W(x) includes Galois Field (GF) multiplying comprising:
   A. storing an input signal in a storage means having an input port for receiving input signals and an output port for supplying stored input signals as output signals; and
   B. recursively GF multiplying the output signals by a GF multiplier to generate the input signals.

17. The method of claim 14 wherein the step of computing the value of an error evaluator polynomial W(x) includes Galois Field (GF) multiplying by $\alpha^i$ signals associated with a received code word, and GF multiplying includes the steps of:
   i. passing in a multiplexer a first input signal during a first predetermined time interval and a second input signal during a second predetermined interval time to obtain a first output signal;
   ii. GF multiplying the first output signal by a first predetermined value to produce a second output signal;
   iii. storing the second output signal during the first predetermined time interval in a first register;
   iv. GF multiplying the second output signal by a second predetermined value to produce a fourth output signal;
   v. storing the fourth output signal during the second predetermined time interval in a second register;
   vi. coupling the stored third output signal to the multiplexer during the first predetermined time interval;
   vii. coupling the stored fourth output signal to the multiplexer during the second predetermined time interval; and
   viii. repeating steps i-vii a predetermined number of times;
   wherein, after a predetermined number of repetitions, said first and second registers contain signals which are associated with the coefficients of the error evaluator polynomial.

18. The method of claim 14 wherein said step of computing the error locations and the error values includes:
   a. computing syndromes $S_i$ for each of the received code words;
   b. simultaneously computing the values of an error locator polynomial NU(x) and an error evaluator polynomial W(x) for each of the received code words, where:

$$NU(x)S(x) = W(x) \text{ modulo } x^t$$

S(x) is a polynomial in x with coefficients $S_i$, t is the number of errors that the Reed-Solomon Code can correct and NU(x) is associated with the error locator equation.

19. The method of claim 18 wherein the step of computing syndromes comprises:
   a. generating the coefficients $S_i$ of a syndrome polynomial S(x) in a plurality of S computers; and
   b. amending the coefficients of S(x) to correspond to a shortened code over Galois Field $(2^m)$.

20. The method of claim 19 wherein the step of generating the coefficients of the syndrome polynomial S(x) comprises:
   a. providing a first output signal from a logical AND circuit responsive to a feedback signal and an input signal;
   b. GF multiplying the first output signal by a predetermined value at a predetermined time to obtain a second output signal;
   c. storing the second output signal in a storage register; and
   d. adding the stored second output signal to a data signal in a modulo-2 adder and providing the sum as the input signal to the logical AND circuit.

21. The method of claim 19 wherein the step of generating coefficients $S_i$ of the syndrome polynomial S(x) includes the steps of:
   i. passing in a multiplexer a first input signal during a first predetermined time interval and a second input signal during a second predetermined interval time to obtain a first output signal;

ii. adding the first output signal to a data signal in a modulo-2 adder to obtain a second output signal;

iii. GF multiplying the second output signal by a first predetermined value to produce a third output signal;

iv. storing the third output signal during the first predetermined time interval in a first register;

v. GF multiplying the third output signal by a second predetermined value to produce a fourth output signal;

vi. storing the fourth output signal during the second predetermined time interval in a second register;

vii. coupling the stored third output signal to the multiplexer during the first predetermined time interval;

viii. coupling the stored fourth output signal to the multiplexer during the second predetermined time interval; and ix. repeating steps i–viii a predetermined number of times;

wherein said first and second registers contain, after the predetermined number of repetitions, signals associated with the syndrome coefficients $S_i$.

22. A decoder for determining the locations of errors in a data code word encoded using an error correction code, the decoder including:

A. means for retrieving code words;

B. means for decoding code words and determining corresponding syndromes;

C. means for iteratively determining, in a predetermined number of iterations, an error locator by:

i. determining a preliminary error locator equation based on said syndromes, ii. iteratively updating the preliminary error locator equation in a predetermined manner, following a given iteration, if the value of a particular variable is within a predetermined value range, iii. updating the value of the particular variable in each iteration by incrementing the variable, and iv. changing the sign of the particular variable if a second particular variable has a predetermined value;

D. error evaluation means for finding the roots of the error locator equation, the roots corresponding to error locations, and error values associated with the error locations; and E. correcting means for correcting errors in the data code words using the error locations and associated error values.

23. The decoder of claim 22, wherein said updating means for the preliminary error location equation uses the Berlekemp-Massey method to determine a next value for the preliminary error locator equation.

24. A circuit for detecting and correcting errors in binary data symbols which have been encoded using a Reed-Solomon error correction code to produce Reed-Solomon code words, wherein each code word includes in it a selected number of data symbols, said circuit comprising:

A. buffer means for receiving at least one code word having the selected number of data symbols and releasing each of the received data symbols after a preselected time period;

B. decoder means for computing for each received code word error locations and error values by (i) determining an error locator equation and finding roots of said error locator equation, the roots corresponding to error locations, and (ii) determining associated error values, the decoder means including means for iteratively determining in a predetermined number of iterations the error locator equation by:

1. determining a preliminary error locator equation, 2. iteratively updating the preliminary error locator equation using the Berlekemp-Massey method following a given iteration if a particular variable has a value in a predetermined value range, 3. updating the particular variable in each iteration by incrementing the variable;

4. changing the sign of the particular variable if a second particular variable has a predetermined value;

C. correcting means responsive to the computed error locations and error values for correcting upon release from the buffer means each of the received data symbols having an error.

25. The circuit of claim 24, wherein said updating means for the preliminary error location equation uses the Berlekemp-Massey method to determine a next value for the preliminary error locator equation.

26. The circuit of claim 25, wherein the iterative means includes means for changing the sign of the particular variable if a second particular variable has a predetermined value.

27. A method for determining the locations of errors in a data word encoded using an error correction code, the method including the steps of:

A. receiving at least one code word;

B. decoding the code word and determining corresponding syndromes;

C. determining a preliminary error locator equation based on the syndromes;

D. iteratively updating the preliminary error locator equation using the Berlekemp-Massey method following a given iteration if a particular variable is within a predetermined range of values;

E. updating the particular variable in each iteration by incrementing the variable;

F. changing the value of the particular variable if a second particular variable has a predetermined value;

G. repeating steps A-E a predetermined number of times;

H. finding (i) the roots of the error locator equation and (ii) the associated error values; and I. correcting errors in the code word using the computed error locations and error values.

* * * * *